(12) United States Patent
Aihara

(10) Patent No.: US 9,318,656 B2
(45) Date of Patent: Apr. 19, 2016

(54) LIGHT-EMITTING DIODE AND METHOD OF MANUFACTURING THE SAME

(71) Applicant: SHOWA DENKO K.K., Minato-ku, Tokyo (JP)

(72) Inventor: Noriyuki Aihara, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 14/366,518

(22) PCT Filed: Dec. 13, 2012

(86) PCT No.: PCT/JP2012/082386
§ 371 (c)(1),
(2) Date: Jun. 18, 2014

(87) PCT Pub. No.: WO2013/094519
PCT Pub. Date: Jun. 27, 2013

(65) Prior Publication Data
US 2015/0034900 A1 Feb. 5, 2015

(30) Foreign Application Priority Data

Dec. 19, 2011 (JP) ................................. 2011-277535

(51) Int. Cl.
| | |
|---|---|
| *H01L 29/06* | (2006.01) |
| *H01L 31/00* | (2006.01) |
| *H01L 33/24* | (2010.01) |
| *H01L 33/20* | (2010.01) |

(Continued)

(52) U.S. Cl.
CPC .............. *H01L 33/24* (2013.01); *H01L 33/005* (2013.01); *H01L 33/0079* (2013.01); *H01L 33/06* (2013.01); *H01L 33/10* (2013.01); *H01L 33/20* (2013.01); *H01L 33/38* (2013.01); *H01L 33/405* (2013.01); *H01L 33/42* (2013.01); *H01L 33/44* (2013.01); *H01L 33/0062* (2013.01); *H01L 33/30* (2013.01); *H01L 33/385* (2013.01); *H01L 2933/0016* (2013.01); *H01L 2933/0025* (2013.01); *H01L 2933/0058* (2013.01)

(58) Field of Classification Search
None
See application file for complete search history.

(56) References Cited

FOREIGN PATENT DOCUMENTS

| | | |
|---|---|---|
| JP | 06-045650 A | 2/1994 |
| JP | 07-176787 A | 7/1995 |

(Continued)

OTHER PUBLICATIONS

International Search Report of PCT/JP2012/082386 dated Jan. 15, 2013.

(Continued)

*Primary Examiner* — Sonya D McCall Shepard
(74) *Attorney, Agent, or Firm* — Sughrue Mion, PLLC

(57) ABSTRACT

A light-emitting diode and manufacturing method, including a flat portion and a mesa structure. An inclined side surface is formed by wet etching such that a cross-sectional area of the mesa structure is continuously reduced toward a top surface. A protective film covers the flat portion, the inclined side surface, and a peripheral region of the top surface of the mesa structure. The protective film includes an electrical conduction window arranged around a light emission hole and from which a compound semiconductor layer is exposed. A continuous electrode film contacts the exposed compound semiconductor layer, covers the protective film formed on the flat portion, and has the light emission hole on the top surface. A transparent conductive film is formed between a reflecting layer and the layer at a position that corresponds to the electrical conduction window and in a range surrounded by the electrical conduction window.

12 Claims, 13 Drawing Sheets

(51) Int. Cl.
*H01L 33/38* (2010.01)
*H01L 33/44* (2010.01)
*H01L 33/00* (2010.01)
*H01L 33/06* (2010.01)
*H01L 33/10* (2010.01)
*H01L 33/42* (2010.01)
*H01L 33/40* (2010.01)
*H01L 33/30* (2010.01)

(56) References Cited

FOREIGN PATENT DOCUMENTS

| | | | |
|---|---|---|---|
| JP | 09-283862 A | | 10/1997 |
| JP | 2003-031842 A | | 1/2003 |
| JP | 2008053476 | * | 3/2008 |
| JP | 2010067891 | * | 3/2010 |
| JP | 2011-198992 A | | 10/2011 |
| KR | 100732191 | * | 6/2007 |
| TW | 200919775 A | | 5/2009 |
| TW | 200935634 A | | 8/2009 |

OTHER PUBLICATIONS

Communication dated Jun. 23, 2015 from the Taiwan Intellectual Property Office issued in corresponding Taiwanese application No. 101147711.

* cited by examiner

LIGHT-EMITTING DIODE AND METHOD OF MANUFACTURING THE SAME

CROSS REFERENCE TO RELATED APPLICATIONS

This is a National Stage of International Application No. PCT/JP2012/082386 filed Dec. 13, 2012, claiming priority based on Japanese Patent Application No. 2011-277535 filed Dec. 19, 2011, the contents of all of which are incorporated herein by reference in their entirety.

FIELD OF THE INVENTION

The present invention relates to a light-emitting diode and a method of manufacturing the same.

DESCRIPTION OF RELATED ART

A point light source type light-emitting diode is known in which light generated by a light-emitting layer is extracted from a portion of the upper surface of an element. In this type of light-emitting diode, a light-emitting diode is known which has a current-blocking structure for limiting an electrically conductive region of a light-emitting layer to a portion of the plane of the light-emitting layer (for example, see Patent Document 1). In the light-emitting diode having the current-blocking structure, a light-emitting region is limited. Since light is emitted from a light emission hole which is provided immediately above this light-emitting region, it is possible to obtain a high light emission output and to input the emitted light to, for example, an optical component with high efficiency.

In the point light source type light-emitting diode, a structure is known in which an active layer has a pillar structure in order to narrow a light-emitting region in a direction parallel to a substrate and a layer including a light emission opening (light emission hole) is provided on a light emission surface of the top of the pillar structure (for example, see Patent Document 2).

FIG. 16 shows a resonator-type light-emitting diode in which a lower mirror layer 132, an active layer 133, an upper mirror layer 134, and a contact layer 135 are sequentially formed on a substrate 131; a pillar structure 137 includes the active layer 133, the upper mirror layer 134, and the contact layer 135; the pillar structure 137 and the periphery thereof are covered with a protective film 138; an electrode film 139 is formed on the protective film 138; and a light emission opening 139a is formed in the electrode film 139 on the top surface 137a (light emission surface) of the pillar structure 137. Reference numeral 140 indicates a rear surface electrode.

PRIOR ART DOCUMENTS

Patent Documents

[Patent Document 1] Japanese Unexamined Patent Application, First Publication No. 2003-31842
[Patent Document 2] Japanese Unexamined Patent Application, First Publication No. 9-283862

SUMMARY OF THE INVENTION

When the pillar structure is formed, a portion other than the pillar structure is removed by anisotropic dry etching after the active layer is formed. Therefore, as shown in FIG. 16, a side surface 137b of the pillar structure 137 is vertical or steeply inclined with respect to the substrate 131. In general, a protective film is formed on the side surface of the pillar structure by a vapor deposition method or a sputtering method and an electrode metal (for example, Au) film is formed on the side surface by a vapor deposition method. However, it is not easy to form the protective film or the electrode metal film on the vertical side surface or the steeply inclined side surface with a uniform thickness and the protective film or the electrode metal film is likely to be a discontinuous film. When the protective film is a discontinuous film (letter A in FIG. 16), the electrode metal film enters the discontinuous portion and contacts the active layer, which causes the leakage of light. In addition, when the electrode metal film is a discontinuous film (letter B in FIG. 16), an electrical conduction failure occurs.

When the portion other than the pillar structure is removed by dry etching, an expensive apparatus is required and the etching time increases.

In the point-light-source-type light-emitting diode as shown in FIG. 16, in which the light emission hole is provided on the top surface of the pillar structure, a current flows in the entire light-emitting layer of the pillar structure. Therefore, a large amount of light is emitted from a portion other than the portion which is arranged immediately below the light emission hole in the light-emitting layer, and the light which is emitted from the portion other than the portion which is arranged immediately below the light emission hole is less likely to be emitted to the outside of the light-emitting diode than light emitted from the portion which is arranged immediately below the light emission hole. Therefore, light extraction efficiency is not improved.

The invention has been made in view of the above-mentioned problems and an object of the invention is to provide a light-emitting diode in which a protective film and an electrode film formed on the protective film are formed with a uniform thickness and which has high light extraction efficiency and a light-emitting diode production method which can reduce leakage or electrical conduction failure, improve yield, and produce a light-emitting diode at a lower cost than in the related art.

The invention provides the following means.

(1) A light-emitting diode is provided that outputs light from a light emission hole to the outside. The light-emitting diode includes: a reflecting layer that consists of metal; and a compound semiconductor layer that sequentially includes an active layer and a contact layer; on a supporting substrate in this order, wherein a flat portion and a mesa structure portion including an inclined side surface and a top surface are provided in an upper part of the light-emitting diode. At least a part of the flat portion and the mesa structure portion are sequentially covered with a protective film and an electrode film. The mesa structure portion includes at least a portion of the active layer. The inclined side surface is formed by wet etching. A cross-sectional area of the mesa structure portion in a horizontal direction is continuously reduced toward the top surface. The protective film covers at least a part of the flat portion, the inclined side surface of the mesa structure portion, and a peripheral region of the top surface of the mesa structure portion and the protective film includes an electrical conduction window which is provided inside the peripheral region in plan view and is arranged around the light emission hole and from which a portion of a surface of the compound semiconductor layer is exposed. The electrode film is a continuous film that comes into contact with the surface of the compound semiconductor layer which is exposed from the electrical conduction window, covers at least a portion of the protective film formed on the flat portion, and has the light emission hole on the top surface of the mesa structure portion. A transparent conductive film is provided between the reflecting layer and the compound semiconductor layer at a position that corresponds to the electrical conduction window and in a range surrounded by the electrical conduction window in plan view.

(2) In the aspect stated in the above (1), the transparent conductive film may consist of any one of ITO, IZO, and ZnO.

(3) In the aspect stated in the above (1) or (2) may further include an ohmic metal portion that consists of AuBe or AuZn and is provided in a peripheral portion of the transparent conductive film which does not overlap the light emission hole in plan view, between the transparent conductive film and the compound semiconductor layer.

(4) In the aspect stated in the above any one of (1) to (3), the contact layer may come into contact with the electrode film.

(5) In the aspect stated in the above any one of (1) to (4), the mesa structure portion may have a rectangular shape in plan view.

(6) In the aspect stated in the above any one of (1) to (5), the mesa structure portion may have a height of 3 μm to 7 μm, and the width of the inclined side surface in plan view may be in the range of 0.5 μm to 7 μm.

(7) In the aspect stated in the above any one of (1) to (6), the light emission hole may have a circular shape or an elliptical shape in plan view.

(8) In the aspect stated in the above (7), the light emission hole may have a diameter of 50 μm to 150 μm.

(9) In the aspect stated in the above any one of (1) to (8), a bonding wire may be provided in a portion of the electrode film on the flat portion.

(10) In the aspect stated in the above any one of (1) to (9), a light-emitting layer that is included in the active layer may have a multiple quantum well structure.

(11) In the aspect stated in the above any one of (1) to (10), the light-emitting layer that is included in the active layer may consist of any one of $(Al_{X1}Ga_{1-X1})_{Y1}In_{1-Y1}P$ ($0 \leq X1 \leq 1$, $0 < Y1 \leq 1$), $(Al_{X2}Ga_{1-X2})As$ ($0 \leq X2 \leq 1$), and $(In_{X3}Ga_{1-X3})As$ ($0 \leq X3 \leq 1$).

(12) A method is provided of manufacturing a light-emitting diode that includes a reflecting layer made of metal and a compound semiconductor layer sequentially including an active layer and a contact layer which are sequentially provided on a supporting substrate, in this order, and that emits light from a light emission hole to the outside. The method includes: a step of forming the compound semiconductor layer that sequentially includes the active layer and the contact layer on a growth substrate; a step of forming a transparent conductive film on the compound semiconductor layer at a position that corresponds to an electrical conduction window to be formed and in a range surrounded by the electrical conduction window in plan view; a step of forming the reflecting layer made of metal on the compound semiconductor layer so as to cover the transparent conductive film; a step of bonding the supporting substrate to the reflecting layer; a step of removing the growth substrate; a step of performing wet etching for the compound semiconductor layer to form a mesa structure portion which is formed such that a cross-sectional area thereof in a horizontal direction is continuously reduced toward a top surface and a flat portion which is arranged around the mesa structure portion; a step of forming a protective film that covers, at least, a part of the flat portion, the inclined side surface of the mesa structure portion, and a peripheral region of the top surface of the mesa structure portion and includes the electrical conduction window which is provided inside the peripheral region in plan view and is arranged around the light emission hole and from which a portion of a surface of the compound semiconductor layer is exposed; and a step of forming an electrode film which is a continuous film that comes into direct contact with the surface of the compound semiconductor layer exposed from the electrical conduction window, that covers at least a portion of the protective film formed on the flat portion, and that has the light emission hole on the top surface of the mesa structure portion.

(13) In the aspect stated in the above (12) may further include a step of forming an ohmic metal portion that consists of AuBe or AuZn, that is provided in a peripheral portion of the transparent conductive film to be formed and that does not overlap the light emission hole in plan view on the compound semiconductor layer, the step being performed between the step of forming the compound semiconductor layer and the step of forming the transparent conductive film.

(14) In the aspect stated in the above (12) or (13), the wet etching may be performed with at least one of a mixture of phosphoric acid, hydrogen peroxide, and water, a mixture of ammonia, hydrogen peroxide, and water, a mixture of bromine and methanol, and a mixture of potassium iodide and ammonia.

Advantageous Effects of Invention

A light-emitting diode according to an aspect of the invention includes a reflecting layer that consists of metal and a compound semiconductor layer sequentially including an active layer and a contact layer which are sequentially provided on a supporting substrate, and outputs light from a light emission hole to the outside. In addition, the light-emitting diode includes a transparent conductive film that is provided between the reflecting layer and the compound semiconductor layer at a position that corresponds to the electrical conduction window and in a range surrounded by the electrical conduction window in plan view. As a result, the amount of light emitted from a portion of the active layer which is arranged immediately below the electrical conduction window and the range surrounded by the electrical conduction window is more than the amount of light emitted from a portion other than the portion which is arranged immediately below the electrical conduction window and the range. In addition, the reflecting layer reflects light which travels from a light-emitting layer to the supporting substrate with high efficiency. Therefore, the percentage of light which travels toward the light emission hole increases and light extraction efficiency is improved.

The light-emitting diode according to the aspect of the invention includes the flat portion and the mesa structure portion including the inclined side surface and the top surface that are provided in its upper part. As a result, it is possible to obtain a high light emission output and to input the emitted light to, for example, an optical component with high efficiency.

In the light-emitting diode according to the aspect of the invention, the inclined side surface of the mesa structure portion is formed by wet etching such that the cross-sectional area thereof in the horizontal direction is continuously reduced toward the top surface. As a result, it is easy to sequentially form the protective film and the electrode film on the side surface of the mesa structure portion, as compared to a case in which the mesa structure portion has a vertical side surface. Therefore, a continuous film with a uniform thickness is formed. As a result, leakage or electrical conduction failure caused by a discontinuous film does not occur and stable and high-brightness light emission is ensured. This effect is obtained when the light-emitting diode has the mesa structure portion with the inclined side surface which is formed by wet etching, regardless of the internal laminated structure of the light-emitting diode or the structure of the substrate.

In the light-emitting diode according to the aspect of the invention, the transparent conductive film is made of any one of ITO, IZO, and ZnO. Therefore, the operating voltage is reduced by high conductivity and high transmittance of light reflected from the reflecting layer is ensured. As a result, a high output is obtained.

The light-emitting diode according to the aspect of the invention includes an ohmic metal portion that consists of AuBe or AuZn and is provided in a peripheral portion of the transparent conductive film which does not overlap the light emission hole in plan view, between the transparent conductive film and the compound semiconductor layer. Therefore, a sufficient ohmic contact with the contact layer is ensured and a transparent portion which is covered with the ohmic metal portion is formed in the transparent conductive film at a position immediately below the light emission hole. As a result, most light which is reflected by the reflecting layer and passes through the transparent portion is emitted from the light emission hole.

In the light-emitting diode according to the aspect of the invention, the contact layer comes into contact with the electrode film. According to this structure, the contact resistance of an ohmic electrode is reduced and low-voltage driving can be performed.

In the light-emitting diode according to the aspect of the invention, the mesa structure portion has a rectangular shape in plan view. According to this structure, a change in the shape of a mesa, which depends on an etching depth, due to the influence of the anisotropy of wet etching during manufacturing is prevented. Therefore, it is easy to control the area of a mesa structure portion and required size and shape are obtained with high-accuracy.

In the light-emitting diode according to the aspect of the invention, each inclined side surface of the mesa structure portion is formed so as to be offset from an orientation flat of the substrate. According to this structure, the influence of anisotropy on four sides of the rectangular mesa structure portion due to the orientation of the substrate is reduced and uniform mesa shape and gradient are obtained.

In the light-emitting diode according to the aspect of the invention, the mesa structure portion has a height of 3 µm to 7 µm and the width of the inclined side surface in plan view is in the range of 0.5 µm to 7 µm. According to this structure, it is easy to sequentially form the protective film and the electrode film on the side surface, as compared to the case in which the mesa structure portion has a vertical side surface. Therefore, a continuous film with a uniform thickness is formed. As a result, leakage or electrical conduction failure caused by a discontinuous film does not occur and stable and high-brightness light emission is ensured.

In the light-emitting diode according to the aspect of the invention, the light emission hole has a circular shape or an elliptical shape in plan view. According to this structure, it is easy to form a uniform contact region, as compared to a structure in which the light emission hole has an angular shape, such as a rectangular shape, and it is possible to prevent, for example, the concentration of a current on the corner. In addition, this structure is suitable for coupling to a fiber in a light-receiving side.

In the light-emitting diode according to the aspect of the invention, the light emission hole has a diameter of 50 µm to 150 µm. According to this structure, when the diameter is less than 50 µm, current density increases in the mesa structure portion and output is saturated with a small amount of current. In contrast, when the diameter is greater than 150 µm, it is difficult to diffuse the current to the entire mesa structure portion. Therefore, the problem of output saturation is solved.

In the light-emitting diode according to the aspect of the invention, a bonding wire is provided on a flat portion of the electrode film. According to this structure, wire bonding is performed on the flat portion to which a sufficient load (and ultrasonic waves) is applied. As a result, wire bonding with high bonding strength is achieved.

In the light-emitting diode according to the aspect of the invention, a light-emitting layer that is included in the active layer has a multiple quantum well structure. According to this structure, a sufficient number of injected carriers are confined in a well layer. Therefore, current density in the well layer increases. As a result, the radiative recombination probability increases and a response speed increases.

Here, the quantum well structure means a structure in which two types of materials with different band gaps and a thin film (on an order of nanometers) made of a material with a small band gap is sandwiched between thin films made of a material with a large band gap. A "multiple quantum well" means a quantum well structure including a plurality of well layers.

According to an aspect of the invention, a method of manufacturing a light-emitting diode is provided that includes a reflecting layer made of metal and a compound semiconductor layer sequentially including a contact layer and an active layer, which are sequentially provided on a supporting substrate, and emits light from a light emission hole to the outside. The method includes a step of forming the compound semiconductor layer that sequentially includes the active layer and the contact layer on a growth substrate and a step of forming a transparent conductive film on the compound semiconductor layer at a position that corresponds to an electrical conduction window to be formed and in a range surrounded by the electrical conduction window in plan view. As a result, the amount of light emitted from a portion of the active layer which is arranged immediately below the electrical conduction window and the range surrounded by the electrical conduction window is more than the amount of light emitted from a portion other than the portion which is arranged immediately below the electrical conduction window and the range. In addition, the reflecting layer reflects light which travels from a light-emitting layer to the supporting substrate with high efficiency. Therefore, the ratio of light which travels toward the light emission hole increases and it is possible to manufacture a light-emitting diode with high light extraction efficiency.

The method of manufacturing a light-emitting diode according to the invention includes a step of bonding the supporting substrate to the reflecting layer and a step of removing the growth substrate. As a result, it is possible to avoid the absorption of light by the growth substrate, such as a GaAs substrate which is generally used as the growth substrate for the compound semiconductor layer, is prevented and it is possible to manufacture a light-emitting diode with a high light emission output.

The method of manufacturing a light-emitting diode according to the invention includes: a step of performing wet etching on the compound semiconductor layer to form a mesa structure portion which is formed such that a cross-sectional area thereof in a horizontal direction is continuously reduced toward a top surface and a flat portion which is arranged around the mesa structure portion; a step of forming a protective film on the flat portion and the mesa structure portion such that an electrical conduction window from which a portion of a surface of the compound semiconductor layer is exposed is formed on the top surface of the mesa structure portion; and a step of forming an electrode film which is a continuous film that comes into direct contact with the surface of the compound semiconductor layer exposed from the electrical conduction window, covers at least a portion of the protective film formed on the flat portion, and has the light emission hole on the top surface of the mesa structure portion. As a result, it is possible to obtain a high light emission output and to input the emitted light to, for example, an optical component with high efficiency. In addition, it is easy to sequentially form the protective film and the electrode film on the inclined side surface, as compared to the case in which the mesa structure portion has a vertical side surface. Therefore, a continuous film with a uniform thickness is formed. As a result, it is possible to manufacture a light-emitting diode which does not have leakage or electrical conduction failure caused by a discontinuous film and ensures stable and high-brightness light emission. When the pillar structure is formed by anisotropic dry etching as in the related art, the side surface is vertically formed. However, when the mesa structure portion is formed by wet etching, it is possible to form a side surface which is gently inclined. In addition, when the mesa structure portion is formed by wet etching, it is possible to reduce the formation time, as compared to the case in which the pillar structure is formed by dry etching as in the related art

DETAILED DESCRIPTION OF THE INVENTION

Figure 1:
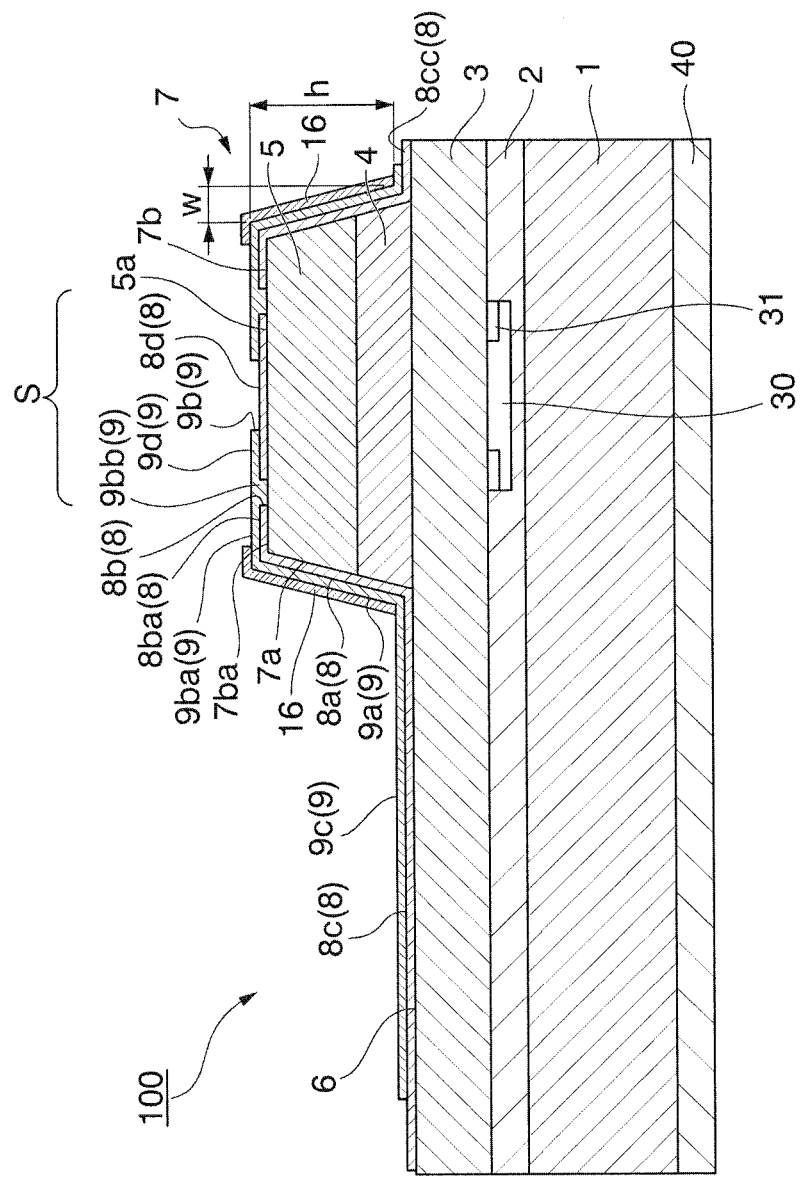
FIG. 1 is a schematic cross-sectional view illustrating a light-emitting diode according to a first embodiment of the invention.

Hereinafter, the structure of a light-emitting diode and a method of manufacturing the same according to the invention will be described with reference to the drawings. In the drawings used in the following description, in some cases, for ease of understanding of characteristics, a characteristic portion is enlarged and the dimensions and scale of each component are different from the actual dimensions and scale. For example, materials and dimensions which are exemplified in the following description are illustrative and the invention is not limited thereto. Various modifications and changes to the invention can be made without departing from the scope and spirit of the invention.

The invention may include layers which are not described in the following as long as the effect of the invention is maintained.

Light-Emitting Diode

First Embodiment

Figure 2:
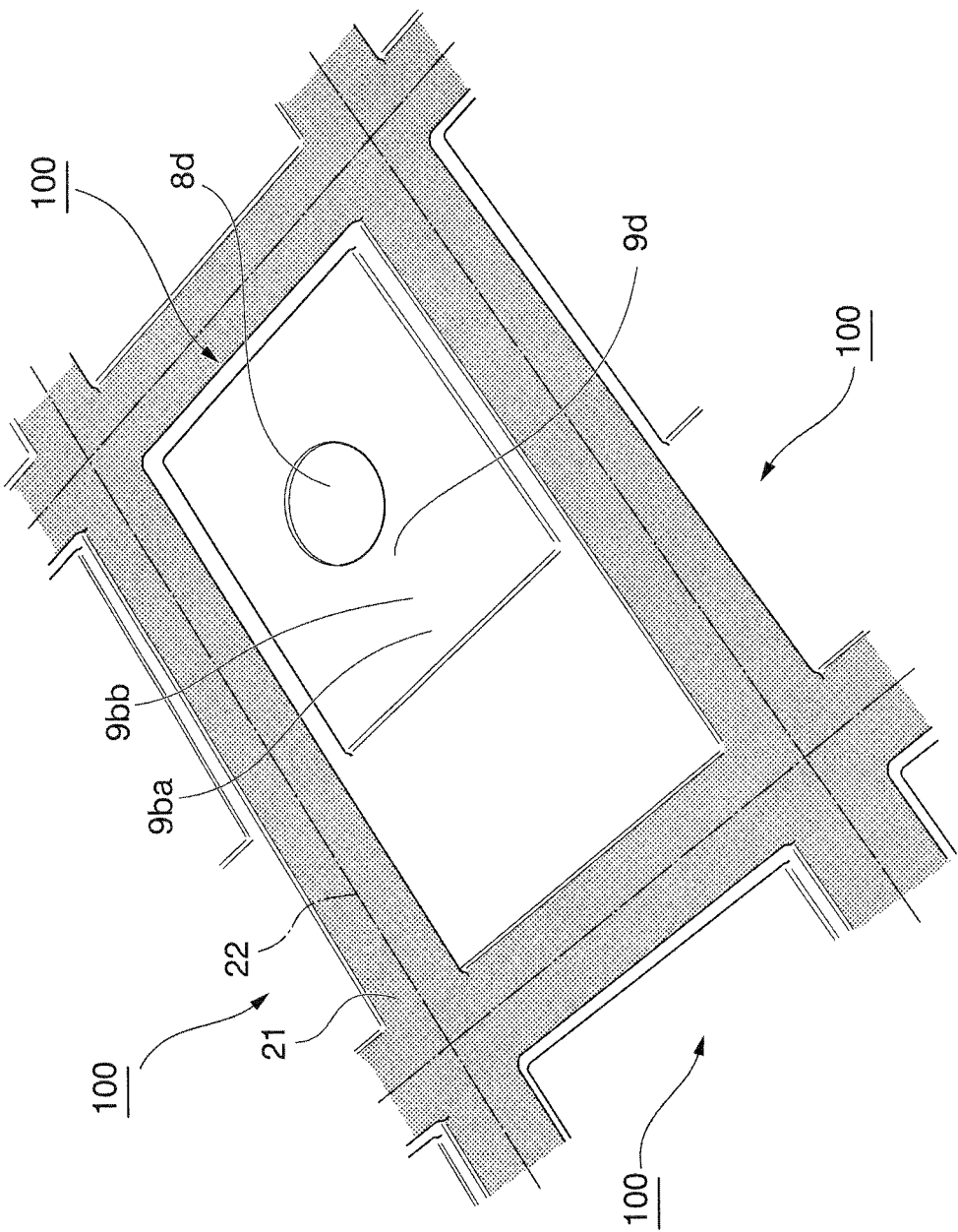
FIG. 2 is a perspective view illustrating the light-emitting diode according to the first embodiment of the invention.

FIG. 1 is a schematic cross-sectional view illustrating an example of a light-emitting diode to which the invention is applied. FIG. 2 is a perspective view illustrating the light-emitting diode formed on a wafer including the light-emitting diode shown in FIG. 1.

Hereinafter, a light-emitting diode according to an embodiment of the invention will be described in detail with reference to FIGS. 1 and 2.

A light-emitting diode 100 shown in FIG. 1 includes a reflecting layer 2 which consists of metal and a compound semiconductor layer 20 (see FIG. 4) that includes an active layer 4 and a contact layer 5 in this order, which are sequentially provided on a supporting substrate 1, and emits light from a light emission hole 9b to the outside. The light-emitting diode includes a flat portion 6 and a mesa structure portion 7 including an inclined side surface 7a and a top surface 7b in its upper part. The flat portion 6 and the mesa structure portion 7 are at least partially covered with a protective film 8 and an electrode film 9, respectively. The mesa structure portion 7 includes at least a portion of the active layer 4. The inclined side surface 7a is formed by wet etching such that the cross-sectional area thereof in the horizontal direction is continuously reduced toward the top surface 7b. The protective film 8 covers at least a portion of the flat portion 6, the inclined side surface 7a of the mesa structure portion 7, and a peripheral region 7ba of the top surface 7b of the mesa structure portion 7. In addition, the protective film 8 includes an electrical conduction window 8b which is provided around the light emission hole 9b inside the peripheral region in plan view and from which a portion of the surface of the compound semiconductor layer 20 (contact layer 5) is exposed. The electrode film 9 comes into contact with the surface of the compound semiconductor layer 20 (contact layer 5) exposed from the electrical conduction window 8b. The electrode film 9 is a continuous film which is formed so as to cover at least a portion of the protective film 8 formed on the flat portion 6 and to have the light emission hole 9b on the top surface 7b of the mesa structure portion 7. A transparent conductive film 30 is provided between the reflecting layer 2 and the compound semiconductor layer 20 (bonding (contact) layer 3) at a position that corresponds to the electrical conduction window 8b and a region S surrounded by the electrical conduction window 8b in plan view. In addition, an ohmic metal portion 31 is provided in a peripheral portion 30a (see FIG. 4) of the transparent conductive film 30 which does not overlap the light emission hole 9b in plan view, between the transparent conductive film 30 and the compound semiconductor layer 20. In addition, the bonding (contact) layer 3 is provided between the reflecting layer 2 and the active layer 4.

In the light-emitting diode according to this embodiment, the mesa structure portion 7 has a rectangular shape in plan view and the light emission hole 9b of the electrode film 9 has a circular shape in plan view. The shape of the mesa structure portion 7 in plan view is not limited to rectangular and the shape of the light emission hole 9b in plan view is not limited to circular.

A light-leakage-prevention film 16 for preventing the leakage of light from the side surface is provided on the electrode film constituting the mesa structure portion 7.

In addition, a rear surface electrode 40 is provided on the lower surface of the substrate 1.

In the drawings, the outside diameter of the transparent conductive film 30 is less than the outside diameter of the ohmic metal portion 31. The dimensional relationship indicates only the magnitude relationship therebetween in terms of a manufacturing process, but does not indicate an indispensable structure of the invention.

As shown in FIG. 2, the light-emitting diode according to the invention can be manufactured by forming a plurality of light-emitting diodes 100 on a wafer-shaped substrate and cutting the wafer-shaped substrate into each light-emitting diode along streets (lines scheduled to be cut) 21 (a one-dot chain line 22 is a center line of the street 21 in the longitudinal direction). That is, a laser beam or a blade contacts the streets 21 along the one-dot chain line 22 to cut the wafer-shaped substrate into each light-emitting diode.

The mesa structure portion 7 protrudes upward from the flat portion 6 and includes the inclined side surface 7a and the top surface 7b. In the example shown in FIG. 1, the inclined side surface 7a includes the entire active layer 4 and the inclined cross-sectional surface of the contact layer 5. The protective film 8, the electrode film (front surface electrode film) 9, and the light-leakage prevention film 16 are sequentially provided on the inclined side surface 7a. The top surface 7b includes the surface of the contact layer 5. The protective film 8 (portions denoted by reference numeral 8ba and reference numeral 8d) and the electrode film 9 (portions denoted by reference numerals 9ba, 9bb and 9d) are provided on the top surface 7b.

The contact layer 5 and at least a portion of the active layer 4 are included in the mesa structure portion 7 according to the invention.

In the example shown in FIG. 1, the contact layer 5 and the entire active layer 4 are included in the mesa structure portion 7. Only a portion of the active layer 4 may be included in the mesa structure portion 7. It is preferable that the entire active layer 4 is included in the mesa structure portion 7. The reason is that light emitted from the active layer 4 is all generated in the mesa structure portion and light extraction efficiency is improved.

The inclined side surface 7a of the mesa structure portion 7 is formed by wet etching. In addition, the mesa structure portion 7 is formed such that the cross-sectional area thereof in the horizontal direction is continuously reduced from the supporting substrate 1 to the top surface 7b. Since the inclined side surface 7a is formed by wet etching, the inclination of the mesa structure portion 7 from the top surface to the supporting substrate 1 is gentle. It is preferable that the height h of the mesa structure portion 7 is in the range of 3 μm to 7 μm and the width w of the inclined side surface 7a in plan view be in the range of 0.5 μm to 7 μm. In addition, it is more preferable that the height h is in the range of 5 μm to 7 μm. The width w is more preferably in the range of 3 μm to 7 μm and most preferably, in the range of 4 μm to 6 μm. In this case, since the side surface of the mesa structure portion 7 is not vertical or steeply inclined, but is gently inclined, it is easy to form the protective film or the electrode metal film to have a uniform thickness and there is no concern that a discontinuous film will be formed. Therefore, light leakage or poor electrical connection due to a discontinuous film is not caused and it is ensured that stable and high-brightness light emission is obtained.

When the wet etching is performed until the height is greater than 7 μm, the inclined side surface is likely to have an overhang shape (inverse tapered shape), which is not preferable. It is more difficult to form the protective film or the electrode film to have a uniform thickness, without any discontinuous portion, when the inclined side surface has the overhang shape (inverse tapered shape) than when the side surface is vertical.

In the specification, the height h means a distance (see FIG. 1) from the surface of the electrode film 9 (a portion denoted by reference numeral 9c) which is formed on the flat portion 6, with the protective film interposed therebetween, to the surface of the electrode film 9 (a portion denoted by reference numeral 9ba) which covers a portion denoted by reference numeral 8ba in the protective film 8 in the vertical direction. The width w means a distance (see FIG. 1) from the edge of the electrode film 9 (a portion denoted by reference numeral 9ba) which covers a portion denoted by reference numeral 8ba in the protective film 8 to the lowest edge of the electrode film 9 (a portion denoted by reference numeral 9a) on the inclined side surface which is connected to the edge in the horizontal direction.

Figure 3:
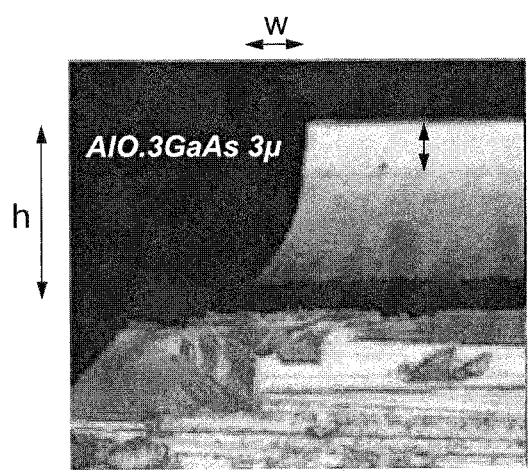
FIG. 3 is an electron micrograph illustrating the cross-section of an inclined surface of a mesa structure portion of the light-emitting diode according to the invention.

FIG. 3 is an electron micrograph of the cross-section in the vicinity of the mesa structure portion 7.

The layer structure shown in FIG. 3 is the same as that in the following example except that a contact layer consists of $Al_{0.3}Ga_{0.7}As$ and has a thickness of 3 μm.

Since the mesa structure portion according to the invention is formed by wet etching, the rate of increase in the horizontal cross-sectional area (or the width or diameter) of the mesa structure portion increases from the top surface toward the substrate (toward the lower side in FIG. 3). It is possible to distinguish that the mesa structure portion is not formed by dry etching, but is formed by wet etching on the basis of this shape.

In the example shown in FIG. 3, the height h was 7 μm and the width w was in the range of 3.5 μm to 4.5 μm.

It is preferable that the mesa structure portion 7 has a rectangular shape in plan view. The reason is as follows. It is possible to suppress a change in the mesa shape depending on an etching depth due to the anisotropy of wet etching during production and it is easy to control the area of each surface of the mesa structure portion. Therefore, required size and shape are obtained with high accuracy.

It is preferable that the mesa structure portion 7 is disposed in the light-emitting diode so as to lean to one side in the long axis direction of the light-emitting diode in order to reduce the size of an element, as shown in FIGS. 1 and 2. Since the flat portion 6 needs to have a width required to attach bonding wires (not shown), there is a limit in reducing the width of the flat portion 6. When the mesa structure portion 7 leans to one side, it is possible to minimize the range of the flat portion 6 and to reduce the size of the element.

The flat portion 6 is arranged around the mesa structure portion 7. In the invention, since wire bonding is performed on the flat portion of the electrode film to which sufficient load and/or ultrasonic waves are applied to the portion, therefore it is possible to perform wire bonding with high bonding strength.

The protective film 8 and the electrode film (front surface electrode film) 9 are sequentially formed on the flat portion 6 and a bonding wire (not shown) is attached onto the electrode film 9. The material forming a portion of the flat portion 6 which is arranged immediately below the protective film 8 is determined by the internal structure of the mesa structure portion 7.

The protective film 8 includes a portion 8a which covers the inclined side surface 7a of the mesa structure portion 7, a portion 8c (including a portion 8cc which is opposite to the portion 8c, with the mesa structure portion 7 interposed therebetween, and covers an opposite flat portion) which covers at least a portion of the flat portion 6, a portion 8ba which covers the peripheral region 7ba of the top surface 7b of the mesa structure portion 7, and a portion 8d which covers a central portion of the top surface 7b. The protective film 8 includes the electrical conduction window 8b which is provided inside the peripheral region 7ba in plan view and from which a portion of the surface of the contact layer 5 is exposed.

In this embodiment, a region (ring-shaped region) between two concentric circuits with different diameters which are provided between the portion 8ba that is disposed below the peripheral region 7ba and a portion that is disposed below the portion 8d covering the central portion on the surface of the contact layer 5 in the top surface 7b of the mesa structure portion 7 is exposed from the electrical conduction window 8b.

The shape of the electrical conduction window 8b is not limited. It is necessary that the electrical conduction window 8b has the ring shape. In addition, the electrical conduction window 8b may be not a continuous region but a plurality of discrete regions.

The protective film 8 is arranged below the front surface electrode film 9 and has a first function of limiting a portion of the front surface electrode film 9 which comes into contact with the compound semiconductor layer 20 and through which a current flows into or out from the compound semiconductor layer 20 to the electrical conduction window 8b of the top surface, in order to narrow a light emission region and a light extraction range. That is, after the protective film 8 is formed, the front surface electrode film is formed on the entire surface including the protective film 8. Then, the front surface electrode film is patterned. Even though the front surface electrode film is not removed from the portion in which the protective film 8 is formed, no current flows. The electrical conduction window 8b of the protective film 8 is formed at the desired position where the current flows.

Therefore, as long as the electrical conduction window 8b is formed in a portion of the top surface 7b of the mesa structure portion 7 in order to make the protective film 8 have the first function, the shape or position of the electrical conduction window 8b is not limited to that shown in FIG. 1.

While the first function is indispensable, the second function of the protective film 8 is not indispensable. The protective film 8 shown in FIG. 1 is arranged on the surface of the contact layer 5 in the light emission hole 9a of the front surface electrode film 9 in plan view and takes on the second function of extracting light through the protective film 8 and protecting the surface of the contact layer 5 which extracts light.

In a second embodiment, which will be described below, the protective film is not provided below the light emission hole and light is directly extracted from the light emission hole 9b, without passing through the protective film. The protective film does not have the second function.

A known material forming an insulating layer can be used as the material forming the protective film 8. A silicon oxide film is preferable since it is easy to form a stable insulating film.

In this embodiment, since light is extracted through the protective film 8 (8d), the protective film 8 needs to be transparent.

The thickness of the protective film 8 is preferably in the range of 0.3 μm to 1 μm and more preferably, in the range of 0.5 μm to 0.8 μm. The reason is that sufficient insulation is not obtained when the thickness is less than 0.3 μm and it takes a lot of time to form the protective film 8 when the thickness is greater than 1 μm.

Here, the thickness of the protective film means the thickness of the protective film in a flat portion, such as the upper surface of the supporting structure portion or the top surface of the mesa structure portion.

The electrode film (front surface electrode film) 9 consists of a portion 9a which covers the portion 8a of the protective film 8 covering the inclined side surface 7a, a portion 9c which covers the portion 8c of the protective film 8 covering at least a portion of the flat portion 6, a portion 9ba which covers the portion 8ba of the protective film 8 covering the peripheral region 7ba of the top surface 7b of the mesa structure portion 7, a portion 9bb (hereinafter, appropriately referred to as a "contact portion") which fills the electrical conduction window 8b of the protective film 8, and a portion 9d which covers the outer circumferential edge of the portion 8d of the protective film 8 covering the central portion of the top surface 7b of the mesa structure portion 7.

The first function of the electrode film (front surface electrode film) 9 is the function of an electrode for current flow and the second function thereof is limiting the emission range of generated light. In the example shown in FIG. 1, the contact portion 9bb takes on the first function and the portion 9d which covers the outer circumferential edge of the portion 8d covering the central portion takes on the second function.

A non-transparent protective film may be used and take on the second function.

The electrode film 9 may cover a portion of or the entire protective film 8 on the flat portion 6. It is preferable that the electrode film 9 covers a range as wide as possible in order to appropriately attach the bonding wire. It is preferable that the street 21 is not covered with the electrode film when the wafer is divided into light-emitting diode in order to reduce costs, as shown in FIG. 2.

In the electrode film 9, only the contact portion 9bb comes into contact with the contact layer 5 in the top surface 7b of the mesa structure portion 7. Therefore, the current which flows in the light-emitting diode flows only through the contact portion 9bb.

A known electrode material which has good ohmic contact with the contact layer can be used as the material forming the electrode film 9. For example, an n-type electrode can have a layer structure (AuGe/Ni/Au) including an AuGe layer, a Ni layer, and an Au layer which are sequentially formed.

The thickness of the electrode film 9 is preferably in the range of 0.5 μm to 2.0 μm and more preferably in the range of 1.2 μm to 1.8 μm. The reason is that it is difficult to obtain a uniform and good ohmic contact, which results in insufficient bonding strength and thickness when the thickness is less than 0.5 μm, and production costs increase when the thickness is greater than 2.0 μm.

The thickness of the electrode film means the thickness of the electrode film in a flat portion, such as the upper surface of the supporting structure portion or the top surface of the mesa structure portion.

Figure 4:
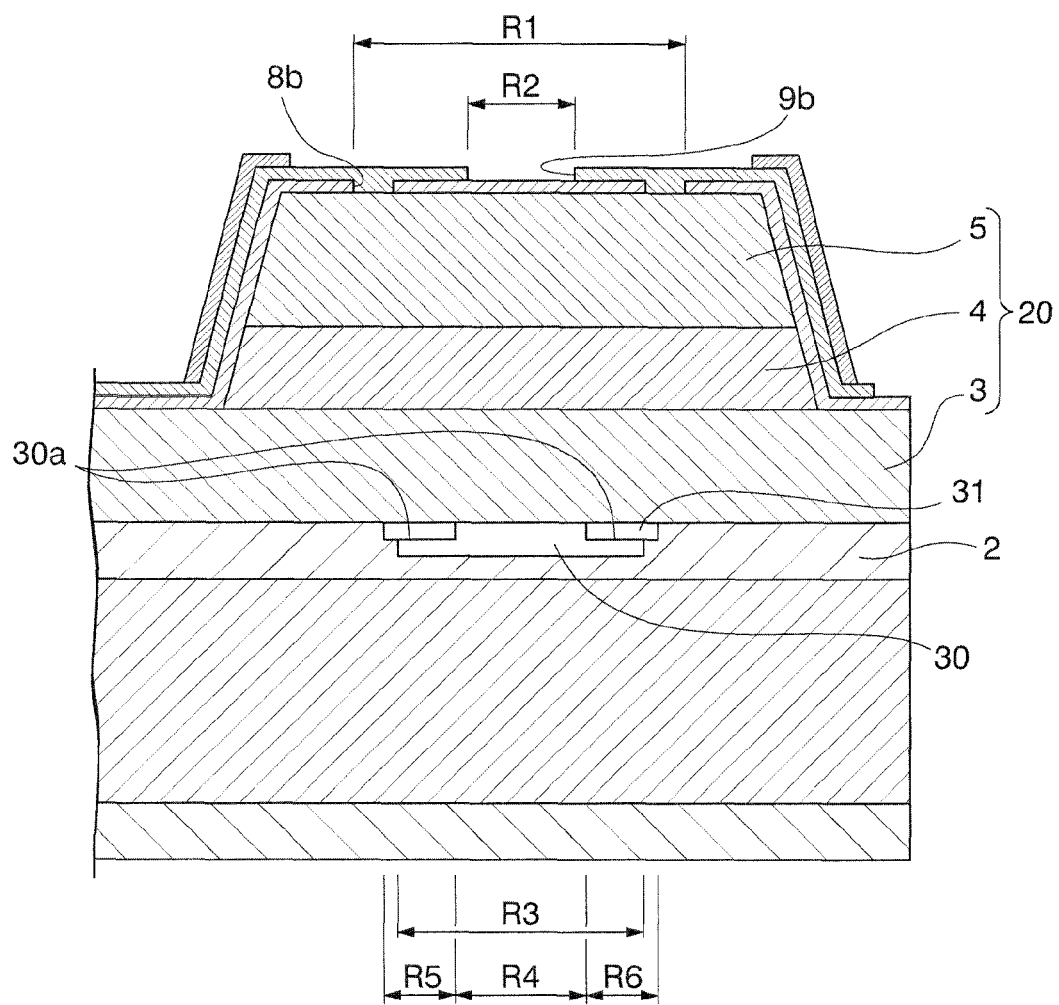
FIG. 4 is an enlarged cross-sectional view illustrating the vicinity of a transparent conductive film and an electrical conduction window of the light-emitting diode according to the first embodiment of the invention.

FIG. 4 is an enlarged cross-sectional view illustrating the vicinity of the transparent conductive film 30 and the electrical conduction window 8b.

In FIG. 4, R1 indicates the electrical conduction window 8b and the range S surrounded by the electrical conduction window 8b (see FIG. 1)). R2 indicates the range (width) of the light emission hole 9b. R3 indicates the range (width) of the transparent conductive film 30. R4 indicates the inside of the ohmic metal portion (a range of the transparent conductive film 30 which is not covered with the ohmic metal portion). R5 and R6 indicate the range in which the ohmic metal portion is formed.

The transparent conductive film 30 is formed between the reflecting layer 2 and the compound semiconductor layer 20 at the position that corresponds to the electrical conduction window 8b and in the range S (see FIG. 1) surrounded by the electrical conduction window 8b in plan view.

The planar arrangement relationship between the components in the cross-section shown in FIG. 4 will be described in reference to FIG. 4. First, R3 (the range of the transparent conductive film 30) is within R1 (the electrical conduction window 8b and the range S surrounded by the electrical conduction window 8b) in plan view.

In addition, R5 and R6 (the range in which the ohmic metal layer is formed) is beyond R2 (the range of the light emission hole 9b). In other words, R2 (the range of the light emission hole 9b) is within R4 (the range of the transparent conductive film 30 which is not covered with the ohmic metal portion).

Since the transparent conductive film 30 is formed in the range S (see FIG. 1), the flow of a current is concentrated between the contact portion 9bb of the electrode film 9 and the transparent conductive film 30, and an amount of current which flows to the other portion is small. As a result, for the amount of light emitted from the light-emitting layer 13, the amount of light emitted from a portion which is arranged immediately below the electrical conduction window 8b and the range S (see FIG. 1) surrounded by the electrical conduction window 8b is significantly more than the amount of light emitted from a portion other than the portion which is arranged immediately below the electrical conduction window 8b and the range S. As a result, the ratio of light emitted from the light emission hole 9b increases and light extraction efficiency is improved.

The material forming the transparent conductive film 30 is not particularly limited as long as it is transparent (translucent) and has high conductivity. For example, ITO, IZO, or ZnO can be used.

The thickness of the transparent conductive film 30 is preferably in the range of 100 nm to 150 nm. The reason is that a sufficient current diffusion effect is not obtained when the thickness is less than 100 nm and the amount of light which is reflected and extracted by the metal reflecting film is reduced when the thickness is greater than 150 nm.

As shown in FIG. 4, the ohmic metal portion 31 may be provided in the peripheral portion 30a of the transparent conductive film 30, which does not overlap the light emission hole 9b in plan view, between the transparent conductive film and the compound semiconductor layer.

The material forming the ohmic metal portion 31 is not particularly limited as long as it can make an ohmic contact with the bonding (contact) layer 5. For example, AuBe or AuZn can be used.

It is preferable that the thickness of the ohmic metal portion is in the range of 0.8 μm to 1.2 μm. The reason is that it is difficult to obtain good contact when the thickness is less than 0.8 μm and raw material efficiency is reduced when the thickness is greater than 1.2 μm.

As shown in FIG. 1, the light leakage prevention film 16, which prevents light emitted from the active layer from leaking from the side surface of the mesa structure portion 7 to the outside of the element, may be provided.

A known reflective material can be used as the material forming the light leakage prevention film 16. For example, when AuGe/Ni/Au is used as the material forming the electrode film 9, AuGe/Ni/Au can be used as the material forming the light leakage prevention film 16.

In this embodiment, the protective film 8d (8) is formed below the light emission hole 9b and light is extracted from the light emission hole 9b through the protective film 8d (8) in the top surface of the mesa structure portion 7.

It is preferable that the light emission hole 9b has a circular or elliptical shape in plan view. The reason is as follows. It is easy to form a uniform contact region, as compared to a structure in which the light emission hole 9b has an angular shape, such as a rectangular shape, and it is possible to prevent, for example, the concentration of a current on the corner. In addition, this structure is suitable for coupling to a fiber in the light-receiving side.

It is preferable that the diameter of the light emission hole 9b is in the range of 50 μm to 150 μm. The reason is as follows. When the diameter is less than 50 μm, current density increases in the light emission portion and output is saturated with a small amount of current. When the diameter is greater than 150 μm, it is difficult to diffuse the current to the entire light emission portion. As a result, light emission efficiency (luminous efficiency) with respect to an input current is reduced.

For example, metal, Ge, Si, GaP, GaInP, or SiC can be used as the material forming the supporting substrate 1. A Ge substrate and a Si substrate have the advantages that they are inexpensive and have high humidity resistance. GaP, GaInP, and SiC substrate have advantages that they have a thermal expansion coefficient close to that of the light emission portion and have high humidity resistance and high thermal conductivity. A metal substrate is inexpensive and has high mechanical strength and high radiation performance. A laminated structure of a plurality of metal layers (metal plates) has the advantage that it can adjust the thermal expansion coefficient of the entire metal substrate, which will be described below.

When the metal substrate is used as the supporting substrate 1, a plurality of metal layers (metal plates) can be laminated.

When the plurality of metal layers (metal plates) are laminated, it is preferable that two types of metal layers are alternately laminated. In particular, in two types of metal layers (for example, they are named a first metal layer and a second metal layer), it is preferable that the total number of the two types of metal layers is an odd number.

For example, when the second metal layer is a metal substrate interposed between the first metal layers, and the second metal layer consists of a material which has a smaller thermal expansion coefficient than the compound semiconductor layer, it is preferable that the first metal layer consists of a material which has a larger thermal expansion coefficient than the compound semiconductor layer, in order to prevent the warping or breaking of the metal substrate. The reason is as follows. Since the thermal expansion coefficient of the entire metal substrate is close to the thermal expansion coefficient of the compound semiconductor layer, it is possible to prevent the warping or breaking of the metal substrate when the compound semiconductor layer and the metal substrate are bonded to each other and to improve the production yield of the light-emitting diode. Similarly, when the second metal layer consists of a material which has a larger thermal expansion coefficient than the compound semiconductor layer, it is preferable that the first metal layer consists of a material which has a smaller thermal expansion coefficient than the compound semiconductor layer. The reason is as follows. Since the thermal expansion coefficient of the entire metal substrate is close to the thermal expansion coefficient of the compound semiconductor layer, it is possible to prevent the warping or breaking of the metal substrate when the compound semiconductor layer and the metal substrate are bonded to each other and to improve the production yield of the light-emitting diode.

From the above-mentioned viewpoint, one of the two types of metal layers may be the first metal layer or the second metal layer.

As the two types of metal layers, for example, a combination of a metal layer which consists of any one of silver (thermal expansion coefficient=18.9 ppm/K), copper (thermal expansion coefficient=16.5 ppm/K), gold (thermal expansion coefficient=14.2 ppm/K), aluminum (thermal expansion coefficient=23.1 ppm/K), nickel (thermal expansion coefficient=13.4 ppm/K), and alloys thereof and a metal layer which is made of any one of molybdenum (thermal expansion coefficient=5.1 ppm/K), tungsten (thermal expansion coefficient=4.3 ppm/K), chromium (thermal expansion coefficient=4.9 ppm/K), and alloys thereof can be used.

As a preferred example, there is a metal substrate including three layers of Cu/Mo/Cu. From the above-mentioned viewpoint, the same effect as described above is obtained from the metal substrate including three layers of Mo/Cu/Mo. Since the metal substrate including three layers of Cu/Mo/Cu has a structure in which the Mo layer with high mechanical strength is interposed between the Cu layers which are easy to process, the metal substrate is easier to cut than a metal substrate consisting of three layers of Mo/Cu/Mo.

For the thermal expansion coefficient of the metal substrate, for example, the thermal expansion coefficient of the metal substrate consisting of three layers of Cu (30 μm)/Mo (25 μm)/Cu (30 μm) is 6.1 ppm/K and the thermal expansion coefficient of the metal substrate consisting of three layers of Mo (25 μm)/Cu (70 μm)/Mo (25 μm) is 5.7 ppm/K.

From the viewpoint of heat dissipation, it is preferable that the metal layer forming the metal substrate consists of a material with high thermal conductivity. In this case, it is possible to improve the radiation performance of the metal substrate and to make the light-emitting diode emit light with high brightness. In addition, it is possible to increase the lifespan of the light-emitting diode.

For example, it is preferable to use silver (thermal conductivity=420 W/m·K), copper (thermal conductivity=398 W/m·K), gold (thermal conductivity=320 W/m·K), aluminum (thermal conductivity=236 W/m·K), molybdenum (thermal conductivity=138 W/m·K), tungsten (thermal conductivity=174 W/m·K), and alloys thereof.

It is more preferable that the metal layers consist of a material with a thermal expansion coefficient that is substantially equal to the thermal expansion coefficient of the compound semiconductor layer. In particular, it is preferable that the material of the metal layer has a thermal expansion coefficient that is ±1.5 ppm/K for the thermal expansion coefficient of the compound semiconductor layer. In this case, it is possible to reduce thermal stress on the light-emitting portion when the metal substrate and the compound semiconductor layer are bonded to each other. As a result, it is possible to suppress the breaking of the metal substrate due to heat caused when the metal substrate is connected to the compound semiconductor layer and to improve the production yield of the light-emitting diode.

For the thermal conductivity of the entire metal substrate, for example, the thermal conductivity of the metal substrate including three layers of Cu (30 μm)/Mo (25 μm)/Cu (30 μm) is 250 W/m·K and the thermal conductivity of the metal substrate including three layers of Mo (25 μm)/Cu (70 μm)/Mo (25 μm) is 220 W/m·K.

When the compound semiconductor layer is grown on a growth substrate, the metal substrate is bonded, and the growth substrate is removed by an etchant, it is preferable that the upper and lower surfaces of the metal substrate are covered with a metal protective film in order to prevent deterioration of it due to the etchant. In addition, it is preferable that the side surface of the metal substrate is covered with the metal protective film.

It is preferable that the metal protective film consists of a material including at least one of chromium and nickel with high adhesion, platinum which is chemically stable, and gold.

It is most preferable that the metal protective film is a layer made of a combination of nickel with high adhesion and gold with high chemical resistance. The thickness of the metal protective film is not particularly limited and is in the range of 0.2 μm to 5 μm in terms of the balance between etchant resistance and costs. Preferably, the optimum range of the thickness is from 0.5 μm to 3 μm. When expensive gold is used, it is preferable that the thickness is equal to or less than 2 μm.

Known functional layers can be timely added to the structure of the reflecting layer 2 and the compound semiconductor layer 20 (the bonding layer 3, the active layer 4, and the contact layer 5). For example, the known layer structure, such as a current diffusion layer for diffusing an element driving current to the entire plane of the light-emitting portion, a current blocking layer for limiting a region through which the element driving current flows, or a current blocking layer, can be used.

Figure 5:
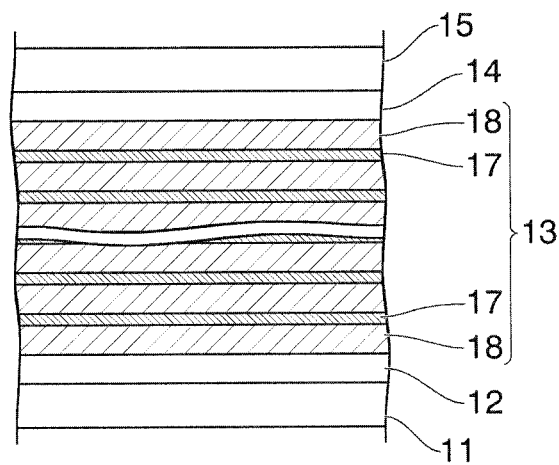
FIG. 5 is a schematic cross-sectional view illustrating an active layer of the light-emitting diode according to the first embodiment of the invention.

As shown in FIG. 5, the active layer 4 includes a lower cladding layer 11, a lower guide layer 12, a light-emitting layer 13, an upper guide layer 14, and an upper cladding layer 15 which are sequentially laminated. That is, in order to emit light with high intensity, it is preferable that the active layer 4 has a so-called double hetero (abbreviated to DH) structure in which the lower cladding layer 11 and the lower guide layer 12, and the upper guide layer 14 and the upper cladding layer 15 are arranged on the upper and lower sides of the light-emitting layer 13 to "confine" carriers causing radiation recombination and light emission to the light-emitting layer 13, respectively.

As shown in FIG. 5, the light-emitting layer 13 can form a quantum well structure in order to control the emission wavelength of the light emitted with the light-emitting diode (LED). That is, the light-emitting layer 13 can have a multi-layer structure (laminated structure) of well layers 17 and barrier layers 18 which has the barrier layers 18 at both ends thereof.

It is preferable that the thickness of the light-emitting layer 13 is in the range of 0.02 μm to 2 μm. The conductivity type of the light-emitting layer 13 is not particularly limited and can be selected from any one of an undoped type, a p type, and an n type. It is preferable that the light-emitting layer 13 is an undoped type with good crystallinity or have a carrier concentration of less than $3 \times 10^{17}$ cm$^{-3}$ in order to improve light emission efficiency.

A known well layer material can be used as the material forming the well layer 17. For example, AlGaAs, InGaAs, or AlGaInP can be used.

The thickness of the well layer 17 is preferably in the range of 3 nm to 30 nm and more preferably in the range of 3 nm to 10 nm.

It is preferable that a material which is suitable for the material forming the well layer 17 is selected as the material forming the barrier layer 18. A material with a composition which has a larger band gap than the material forming the well layer 17 is preferably used in order to prevent the absorption of light by the barrier layer 18 and to improve light emission efficiency.

For example, when AlGaAs or InGaAs is used as the material forming the well layer 17, it is preferable that AlGaAs or AlGaInP is used as the material forming the barrier layer 18. When AlGaInP is the material forming the barrier layer 18, the barrier layer 18 has high crystallinity and contributes to a high output since it does not include As which is likely to cause a defect.

When $(Al_{X1}Ga_{1-X1})_{Y1}In_{1-Y1}P$ (0≤X1≤1, 0<Y1≤1) is used as the material forming the well layer 17, $(Al_{X4}Ga_{1-X4})_{Y1}In_{1-Y1}P$ (0≤X4≤1, 0<Y1≤1, X1<X4) with a composition containing Al in a large amount or AlGaAs with a higher band gap energy than the well layer $(Al_{X1}Ga_{1-X1})_{Y1}In_{1-Y1}P$ (0≤X1≤1, 0<Y1≤1) can be used as the material forming the barrier layer 18.

It is preferable that the thickness of the barrier layer 18 is equal to or greater than the thickness of the well layer 17. When the thickness of the barrier layer 18 is sufficiently large in a thickness range in which a tunnel effect is obtained, the spreading of carriers between the well layers due to the tunnel effect is suppressed and the effect of confining the carriers is improved. Therefore, the radiative recombination probability of electrons and holes increases and it is possible improve an emission output.

In the multi-layer structure of the well layers 17 and the barrier layers 18, the number of pairs of the well layers 17 and the barrier layers 18 which are alternately laminated is not particularly and it is preferable that the number of pairs is equal to or greater than 2 and equal to or less than 40. That is, it is preferable that the light-emitting layer 13 includes 2 to 40 well layers 17. It is preferable that five or more well layers 17 are provided in terms of the optimal light emission efficiency range of the light-emitting layer 13. When a large number of pairs of the well layers 17 and the barrier layers 18 are provided, the forward voltage ($V_F$) increases since the well layer 17 and the barrier layer 18 have low carrier concentration. Therefore, the number of pairs of the well layers 17 and the barrier layers 18 is preferably equal to or less than 40 and more preferably equal to less than 20.

As shown in FIG. 5, the lower guide layer 12 and the upper guide layer 14 are provided on the lower and upper surfaces of the light-emitting layer 13, respectively. Specifically, the lower guide layer 12 is provided on the lower surface of the light-emitting layer 13 and the upper guide layer 14 is provided on the upper surface of the light-emitting layer 13.

A known compound semiconductor material can be used as the material forming the lower guide layer 12 and the upper guide layer 14. It is preferable to select a material which is suitable for the material forming the light-emitting layer 13. For example, AlGaAs or AlGaInP can be used.

For example, when AlGaAs or InGaAs is used as the material forming the well layer 17 and AlGaAs or AlGaInP is used as the material forming the barrier layer 18, AlGaAs or AlGaInP is preferable as the material forming the lower guide layer 12 and the upper guide layer 14. When AlGaInP is used as the material forming the lower guide layer 12 and the upper guide layer 14, the lower guide layer 12 and the upper guide layer 14 have high crystallinity and contribute to a high output since they do not include As which is likely to cause a defect.

When $(Al_{X1}Ga_{1-X1})_{Y1}In_{1-Y1}P$ (0≤X1≤1, 0<Y1≤1) is used as the material forming the well layer 17, $(Al_{X4}Ga_{1-X4})_{Y1}In_{1-Y1}P$ (0≤X4≤1, 0<Y1≤1, X1<X4) with a high Al composition or AlGaAs with a higher band gap energy than the well layer $(Al_{X1}Ga_{1-X1})_{Y1}In_{1-Y1}P$ (0≤X1≤1, 0<Y1≤1) can be used as the material forming the guide layer 14.

The lower guide layer 12 and the upper guide layer 14 are provided in order to reduce the propagation of defects between the lower and upper cladding layers 11 and 15 and the light-emitting layer 13. Therefore, the thickness of the lower guide layer 12 and the upper guide layer 14 is preferably equal to or greater than 10 nm and more preferably in the range of 20 nm to 100 nm.

The conductivity type of the lower guide layer 12 and the upper guide layer 14 is not particularly limited and can be selected from any one of an undoped type, a p type, and an n type. It is preferable that the guide layers are an undoped type with good crystallinity or have a carrier concentration of less than $3 \times 10^{17}$ cm$^{-3}$ in order to improve light emission efficiency.

As shown in FIG. 5, the lower cladding layer 11 and the upper cladding layer 15 are provided on the lower surface of the lower guide layer 12 and the upper surface of the upper guide layer 14, respectively.

A known compound semiconductor material can be used as the material forming the lower cladding layer 11 and the upper cladding layer 15. It is preferable to select a material which is suitable for the material forming the light-emitting layer 13. For example, AlGaAs or AlGaInP can be used.

For example, when AlGaAs or InGaAs is used as the material forming the well layer 17 and AlGaAs or AlGaInP is used as the material forming the barrier layer 18, AlGaAs or AlGaInP is preferable as the material forming the lower cladding layer 11 and the upper cladding layer 15. When AlGaInP is used as the material forming the lower cladding layer 11 and the upper cladding layer 15, the lower cladding layer 11 and the upper cladding layer 15 have high crystallinity and contribute to a high output since they do not include As which is likely to cause a defect.

When $(Al_{X1}Ga_{1-X1})_{Y1}In_{1-Y1}P$ (0≤X1≤1, 0<Y1≤1) is used as the material forming the well layer 17, $(Al_{X4}Ga_{1-X4})_{Y1}In_{1-Y1}P$ (0≤X4≤1, 0<Y1≤1, X1<X4) with a composition containing Al in a large amount or AlGaAs with a higher band gap energy than the well layer $(Al_{X1}Ga_{1-X1})_{Y1}In_{1-Y1}P$ ($0 \leq X1 \leq 1$, $0 < Y1 \leq 1$) can be used as the material forming the cladding layer 15.

The lower cladding layer 11 and the upper cladding layer 15 are configured so as to have different polarities. The carrier concentration and thickness of the lower cladding layer 11 and the upper cladding layer 15 can be set in the known proper range. It is preferable to optimize conditions such that the light emission efficiency of the light-emitting layer 13 is improved. The lower and upper cladding layers don't have to be provided.

In addition, it is possible to control the composition of the lower cladding layer 11 and the upper cladding layer 15 to reduce the warping of the compound semiconductor layer 20.

The contact layer 5 is provided in order to reduce contact resistance with the electrode. It is preferable that the contact layer 5 is made of a material with a higher band gap energy than that forming the light-emitting layer 13. The lower limit of the carrier concentration of the contact layer 5 is preferably equal to or greater than $5 \times 10^{17}$ cm$^{-3}$ and more preferably equal to or greater than $1 \times 10^{18}$ cm$^{-3}$, in order to reduce the contact resistance with the electrode. It is preferable that the upper limit of the carrier concentration is equal to or less than $2 \times 10^{19}$ cm$^{-3}$ at which crystallinity is likely to be reduced. It is preferable that the thickness of the contact layer 5 is equal to or greater than 0.05 μm. The upper limit of the thickness of the contact layer 5 is not particularly limited and is preferably equal to or less than 10 μm in order to set costs for epitaxial growth in a proper range.

The light-emitting diode according to the invention can be incorporated into electronic apparatuses, such as lamps, backlights, mobile phones, displays, various types of panels, computers, game machines, and illuminators, or mechanical devices, such as vehicles into which the electronic apparatuses are incorporated.

Light-Emitting Diode

Second Embodiment

Figure 6:
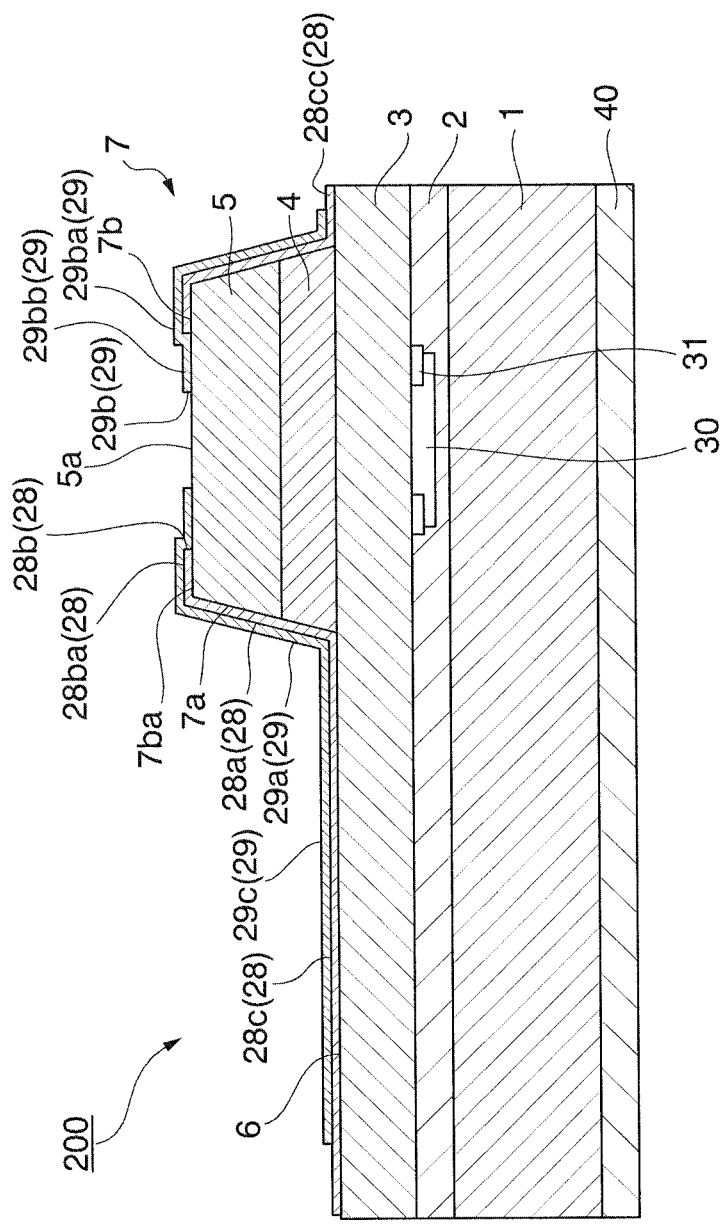
FIG. 6 is a schematic cross-sectional view illustrating a light-emitting diode according to a second embodiment of the invention.

FIG. 6 is a schematic cross-sectional view illustrating another example of the light-emitting diode which is an example of the light-emitting diode to which the invention is applied.

In the first embodiment, the protective film is formed below the light emission hole and light is extracted from the light emission hole through the protective film in the top surface of the mesa structure portion. A second embodiment has a structure in which the protective film is not provided below the light emission hole and light is directly extracted from a light emission hole 9b, without passing through the protective film.

That is, in a light-emitting diode 200 according to the second embodiment, a protective film 28 covers at least a portion 28c of a flat portion 6, an inclined side surface 7a of a mesa structure portion 7, and a peripheral region 7ba of a top surface 7b of the mesa structure portion 7. In addition, the protective film 28 includes an electrical conduction window 28b which is provided inside the peripheral region 7ba in plan view and from which the surface of a contact layer 5 is exposed. An electrode film 29 covers at least a portion of the flat portion 6 through the protective film 28, covers the inclined side surface 7a of the mesa structure portion 7 through the protective film 28, and covers the peripheral region 7ba of the top surface 7b of the mesa structure portion 7 through the protective film 28. In addition, the electrode film 29 includes a light emission hole 29b which is formed by covering only a portion of the surface of the contact layer 5 exposed from the electrical conduction window 28b in the top surface of the mesa structure portion 7 and from which another portion 5a of the surface of the contact layer 5 is exposed.

As shown in FIG. 6, the protective film 28 according to the second embodiment includes a portion 28a which covers the inclined side surface 7a of the mesa structure portion 7, a portion 28c (including a portion 28cc which is opposite to the portion 28c, with the mesa structure portion 7 interposed therebetween, and covers an opposite flat portion) which covers at least a portion of the flat portion 6, and a portion 28ba which covers the peripheral region 7ba of the top surface 7b of the mesa structure portion 7. In addition, the protective film 28 includes the electrical conduction window 28b which is provided inside the peripheral region 7ba in plan view and from which the surface of the contact layer 5 is exposed. That is, a portion other than the portion of the surface of the contact layer 5 which is disposed below the peripheral region 7ba in the top surface 7b of the mesa structure portion 7 is exposed from the electrical conduction window 28b. The electrode film (front surface electrode film) 29 is formed on the protective film 8. The protective film 28 is formed in a portion in which no current flows.

As shown in FIG. 6, the electrode film (front surface electrode film) 29 according to the second embodiment includes a portion 29a which covers the portion 28a of the protective film 28 covering the inclined side surface 7a, a portion 29c which covers the portion 28c of the protective film 28 covering at least a portion of the flat portion 6, a portion 29ba which covers the portion 28ba of the protective film 28 covering the peripheral region 7ba of the top surface 7b of the mesa structure portion 7, and a portion 29bb which covers the contact layer 5 over a portion 28ba of the protective film 28 in the top surface 7b of the mesa structure portion 7 such that the light emission hole 29b is formed.

In the electrode film (front surface electrode film) 29 according to the second embodiment, the portion 29bb takes on both the first function and the second function.

[Method for Producing Light-Emitting Diode]

Next, a method of manufacturing the light-emitting diode according to the invention will be described.

<Process of Producing Supporting Substrate>

Figure 11A:
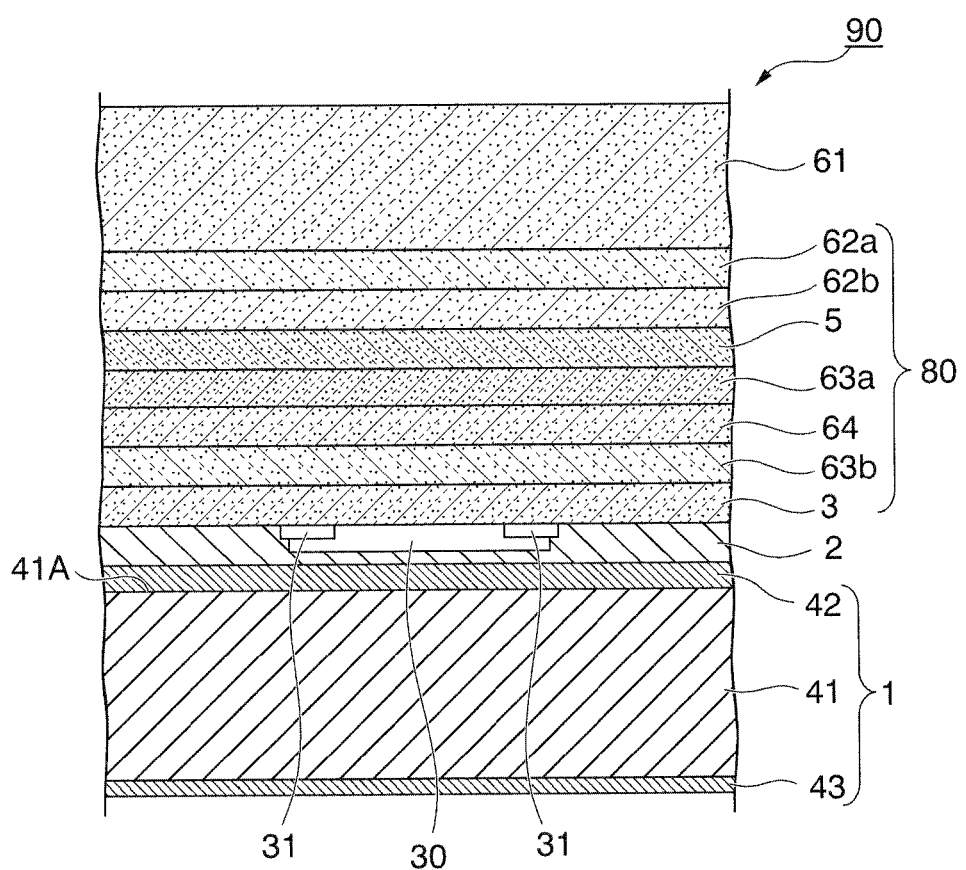
FIG. 11A is a process cross-sectional view illustrating an example of the method for producing the light-emitting diode according to the first embodiment of the invention.

[1] when Ge Substrate is Used as Supporting Substrate 1 (See Reference Numerals Shown in FIG. 11A)

A layer structure (a layer including Ti/Au/In) 42 including, for example, a Ti layer, an Au layer, and an In layer which are sequentially laminated is formed on a front surface 41A of a germanium substrate 41 and a layer structure (a layer including Ti/Au) 43 including, for example, a Ti layer and an Au layer which are sequentially laminated is formed on a rear surface of the germanium substrate 41. In this way, the supporting substrate 1 is produced.

[2] When Metal Substrate is Used as Supporting Substrate 1

Modification Example

Figure 7:
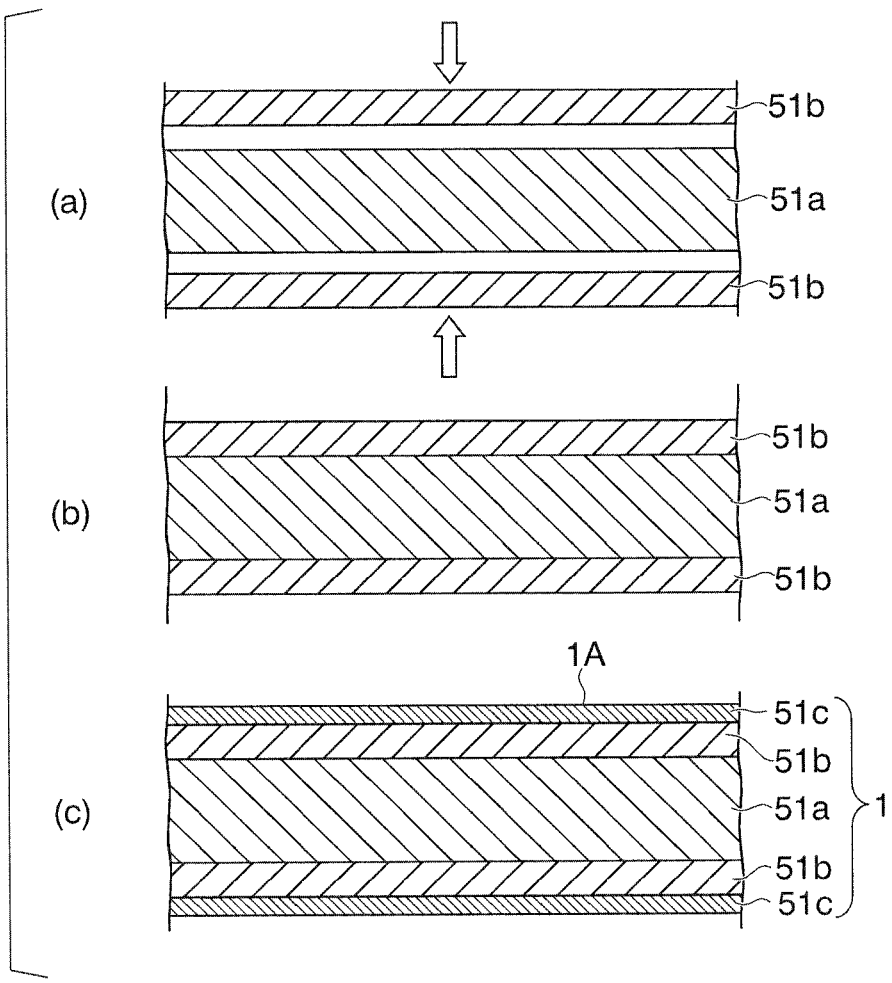
FIG. 7 is a process cross-sectional view illustrating an example of a process of producing a metal substrate used as a supporting substrate according to the invention.

FIGS. 7(a) to 7(c) are schematic cross-sectional views illustrating a portion of the metal substrate for describing a process of manufacturing the metal substrate.

A first metal layer (first metal plate) 51b which has a larger thermal expansion coefficient than the material forming the active layer and a second metal layer (second metal plate) 51a which has a smaller thermal expansion coefficient than the material forming the active layer are used as the metal substrate 1 and the substrate 1 is formed by performing a hot press.

Specifically, first, two first metal layers 51b which are substantially flat plates and one second metal layer 51a which is a substantially flat plate are prepared. For example, a Cu layer with a thickness of 10 μm is used as the first metal layer 51b and a Mo layer with a thickness of 75 μm is used as the second metal layer 51a.

Then, as shown in FIG. 7(a), the second metal layer 51a is inserted between the two first metal layers 51b so as to overlap each other.

Then, these metal layers which overlap each other are arranged in a predetermined pressing apparatus and a load is applied to the first metal layer 51b and the second metal layer 51a in the direction of arrows at a high temperature. Then, as shown in FIG. 7(b), the metal substrate 1 consisting of three layers, that is, the Cu layer (10 μm), which is the first metal layer 51b, the Mo layer (75 μm) which is the second metal layer 51a, and the Cu layer (10 μm) which is the first metal layer 51b, is formed.

For example, the metal substrate 1 has a thermal expansion coefficient of 5.7 ppm/K and a thermal conductivity of 220 W/m·K.

Then, as shown in FIG. 7(c), a metal protective film 51c which covers the entire surface, that is, the upper, lower, and side surfaces of the metal substrate 1 is formed. In this case, since the metal substrate has not been divided into each light-emitting diode, the side surface of the metal substrate which is covered with the metal protective film means the outer circumferential side surface of the metal substrate (plate). Therefore, when the metal protective film 51c covers the side surface of the metal substrate 1 of each divided light-emitting diode, a process of covering the side surface with the metal protective film is separately performed.

FIG. 7(c) shows a portion of the metal substrate (plate), not the outer circumferential end. Therefore, the metal protective film on the outer circumferential side surface is not shown in FIG. 7(c).

The metal substrate doesn't have to include the metal protective film.

The metal protective film can be formed by a known film formation method. A plating method by which can form a film on the entire surface including the side surface is most preferable.

For example, by using an electroless plating method, nickel, gold are sequentially plated for the metal substrate 1. Then the metal substrate 1, whose upper, side, and lower surface are sequentially covered with the nickel film and the gold film (metal protective film), is obtained.

A plating material is not particularly limited and a known material, such as copper, silver, nickel, chromium, platinum, or gold can be used. A layer made of a combination of nickel with high adhesion and gold with high chemical resistance is optimal.

The plating method can use a known technique and a known chemical. The electroless plating method which does not require an electrode is simple and preferable.

<Process of Forming Compound Semiconductor Layer>

Figure 8:
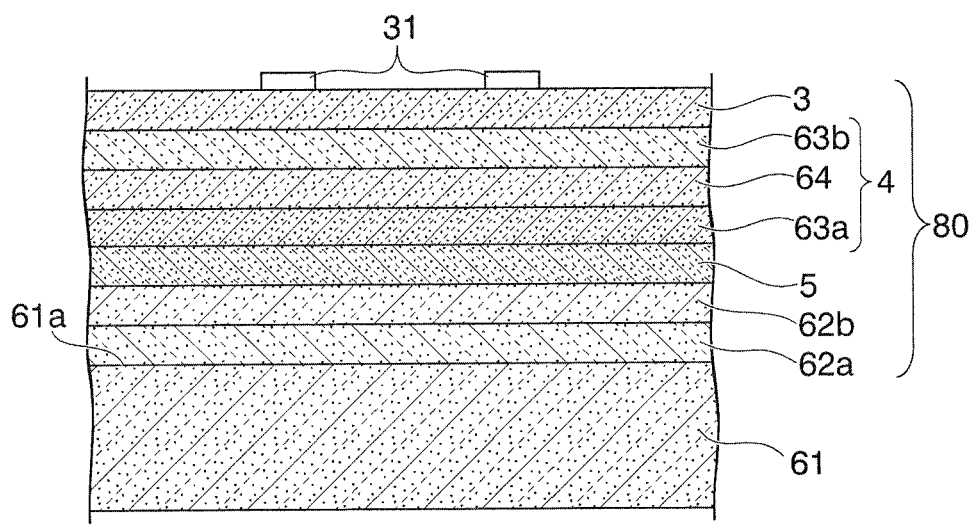
FIG. 8 is a schematic cross-sectional view illustrating a method for producing the light-emitting diode according to the first embodiment of the invention.

First, as shown in FIG. 8, a plurality of epitaxial layers are grown on one surface 61a of a semiconductor substrate (growth substrate) 61 to form an epitaxial laminate 80 including the active layer 4.

The semiconductor substrate 61 is used to form the epitaxial laminate 80. For example, the semiconductor substrate 61 is a Si-doped n-type GaAs single crystal substrate in which one surface 61a is inclined at 15° with respect to the (100) plane. When an AlGaInP layer or an AlGaAs layer is used as the epitaxial laminate 80, a gallium arsenide (GaAs) single crystal substrate can be used as the substrate for forming the epitaxial laminate 80.

As a method for forming the active layer 4, for example, the following method can be used: a metal organic chemical vapor deposition (MOCVD) method; a molecular beam epitaxicy (MBE) method; or a liquid phase epitaxicy (LPE) method.

In this embodiment, each layer is epitaxially grown by using a low pressure MOCVD method with trimethylaluminum (($CH_3$)$_3$Al), trimethylgallium (($CH_3$)$_3$Ga) and trimethylindium (($CH_3$)$_3$In) as a raw material for a group-III element.

Bis(cyclopentadienyl)magnesium (($C_5H_5$)2Mg) is used as a MG doping material. In addition, disilane ($Si_2H_6$) is used as a Si doping material. Phosphine ($PH_3$) or arsine ($AsH_3$) is used as a raw material for a group-V element.

A p-type GaP layer 3 is grown at a temperature of, for example, 750° C. and the other epitaxially grown layers are grown at a temperature of, for example, 730° C.

Specifically, first, a buffer layer 62a which consists of Si-doped n-type GaAs is formed on the one surface 61a of the growth substrate 61. For example, the buffer layer 62a is made of, for example, Si-doped n-type GaAs and has a carrier concentration of $2 \times 10^{18}$ cm$^{-3}$ and a thickness of 0.2 μm.

Then, in this embodiment, an etching stop layer 62b is formed on the buffer layer 62a.

The etching stop layer 62b is used to prevent the cladding layer and the light-emitting layer from being etched when the semiconductor substrate is removed by etching, consists of, for example, Si-doped ($Al_{0.5}Ga_{0.5}$)$_{0.5}In_{0.5}$P, and has a thickness of 0.5 μM.

Then, the contact layer 5 which consists of, for example, Si-doped n-type $Al_XGa_{1-X}$As (0.1≤X≤0.3) is formed on the etching stop layer 62b.

Then, a cladding layer 63a which consists of, for example, Si-doped n-type ($Al_{0.7}Ga_{0.3}$)$_{0.5}In_{0.5}$P is formed on the contact layer 5.

Then, a light-emitting layer 64 having a laminated structure of three pairs of well layers and barrier layers which respectively consists of, for example, pairs of $Al_{0.17}Ga_{0.83}$As and $Al_{0.3}Ga_{0.7}$As are formed on the cladding layer 63a.

Then, a cladding layer 63b which consists of, for example, Mg-doped p-type ($Al_{0.7}Ga_{0.3}$)$_{0.5}In_{0.5}$P is formed on the light-emitting layer 64.

Then, a bonding (contact) layer 3 which is, for example, a Mg-doped p-type GaP layer is formed on the cladding layer 63b.

Before the epitaxial laminate is bonded to a substrate, such as a metal substrate which will be described below, it is preferably polished by about 1 μm in order to process the bonding surface (that is, to perform a mirroring process such that surface roughness is equal to or less than, for example, 0.2 nm).

A guide layer may be provided between the cladding layer and the light-emitting layer.

<Process of Forming Transparent Conductive Film and Ohmic Metal Portion>

(Formation of Ohmic Metal Portion)

Then, as shown in FIG. 8, first, the ohmic metal portion 31 is formed in the peripheral portion 30a of the transparent conductive film 30 (see FIG. 1) to be formed which does not overlap the light emission hole to be formed in plan view on the bonding (contact) layer 3. Since the transparent conductive film 30 (see FIG. 1) is formed in the range corresponding to the electrical conduction window to be formed and the range S (see FIG. 1) surrounded by the electrical conduction window, the ohmic metal portion 31 is also formed in the range.

Specifically, a film which consists of a metal material forming the ohmic metal portion is formed on the entire surface of the bonding (contact) layer 3 by, for example, a vapor deposition method. Then, the film which consists of the metal material is patterned by a photolithography method to form the ohmic metal portion 31 with the above-mentioned shape at a predetermined position.

The ohmic metal portion 31 may be formed by a liftoff technique. That is, a mask which has an opening corresponding to the shape of the ohmic metal portion at the formation position of the ohmic metal portion may be formed on the bonding (contact) layer 3, a film which is made of a metal material forming the ohmic metal portion may be formed on the mask by the vapor deposition method, and the mask may be removed to form the ohmic metal portion 31.

(Formation of Transparent Conductive Film)

Figure 9:
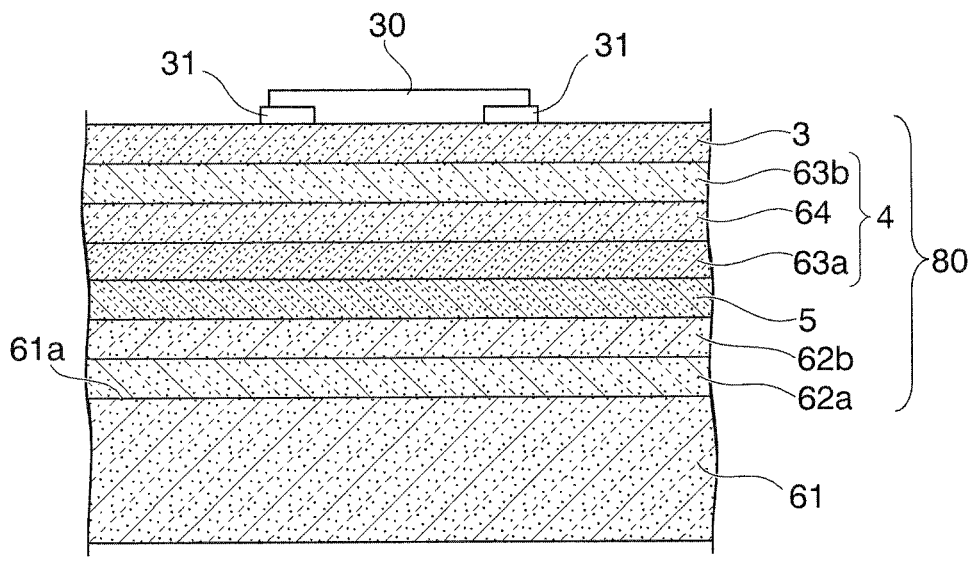
FIG. 9 is a process cross-sectional view illustrating an example of the method for producing the light-emitting diode according to the first embodiment of the invention.

Then, as shown in FIG. 9, the transparent conductive film 30 is formed on the bonding (contact) layer 3 at the position that corresponds to the electrical conduction window to be formed and the range S (see FIG. 1) surrounded by the electrical conduction window in plan view.

Specifically, a film which is made of a material forming a transparent conductive film is formed on the entire surface of the bonding (contact) layer 3 by, for example, a CVD method so as to cover the ohmic metal portion 31. Then, the transparent conductive film is patterned by a photolithography method to form the transparent conductive film 30 with the above-mentioned shape at the position which corresponds to the electrical conduction window to be formed and in the range surrounded by the electrical conduction window.

The transparent conductive film 30 may be formed by the liftoff technique. That is, a mask which has an opening corresponding to the shape of the transparent conductive film 30 at the formation position of the transparent conductive film 30 may be formed on the bonding (contact) layer 3, a film which is made of a metal material forming the transparent conductive film may be formed on the mask by, for example, the CVD method, and the mask may be removed to form the transparent conductive film 30.

<Process of Forming Reflecting Layer>

Figure 10:
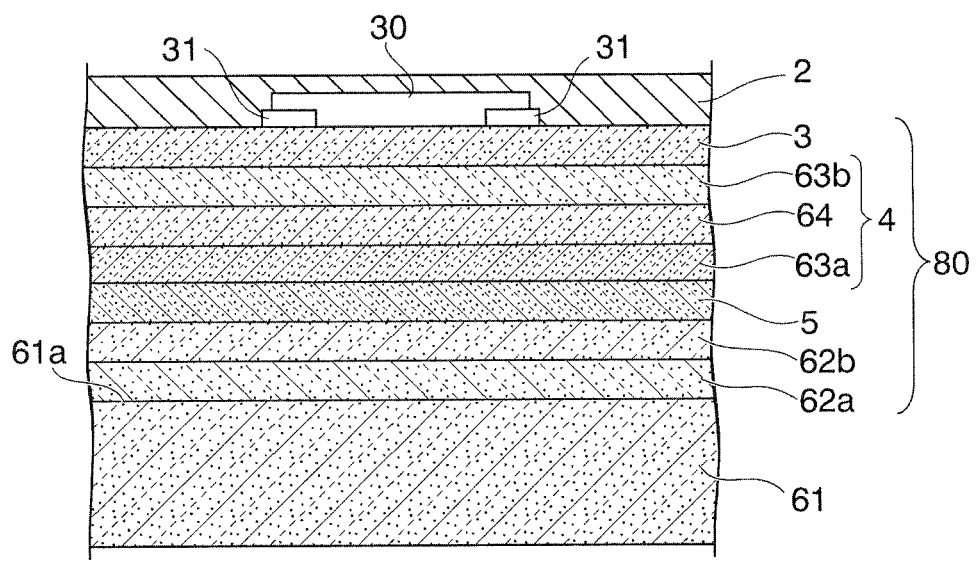
FIG. 10 is a process cross-sectional view illustrating an example of the method for producing the light-emitting diode according to the first embodiment of the invention.

Then, as shown in FIG. 10, a reflecting layer 2 which is made of, for example, Au is formed on the bonding (contact) layer 3 so as to cover the transparent conductive film 30.

<Process of Bonding Supporting Substrate>

[1] when Ge Substrate is Used as Supporting Substrate 1 (See Reference Numerals in FIG. 11A)

The In layer on the front surface of the supporting substrate 1, which is produced by forming the layer 42 including a Ti layer, an Au layer, and an In layer on the front surface of the germanium substrate 41 and by forming the layer 43 including a Ti layer and an Au layer on the rear surface, and the reflecting layer 2 which consists of Au in the structure shown in FIG. 10 overlap each other, are heated at, for example, 320° C., and are pressed at 500 g/cm². In this way, as shown in FIG. 11A, the supporting substrate 1 is bonded to the structure including the epitaxial laminate.

[2] When Metal Substrate is Used as Supporting Substrate 1

Before the metal substrate is bonded to the reflecting layer 2, a barrier layer (not shown) and/or a bonding layer (not shown) may be formed on the reflecting layer 2.

The barrier layer can prevent metal contained in the metal substrate from being diffused and reacting with the reflecting layer 2.

The barrier layer can be made of, for example, nickel, titanium, platinum, chromium, tantalum, tungsten, or molybdenum. The barrier layer may be a combination of two or more types of metal layers, for example, a combination of a platinum layer and a titanium layer which are sequentially provided from the reflecting layer. In this case, it is possible to improve the performance of the barrier.

The barrier layer doesn't have to be provided when these materials are added to the bonding layer, the bonding layer has the same function as the barrier layer.

The bonding layer is used to closely bond, for example, a compound semiconductor layer 20 including the active layer 4 to the metal substrate.

For example, an Au-based eutectic metal material which is chemically stable and has a low melting point can be used as the material forming the bonding layer. Examples of the Au-based eutectic metal material include eutectic alloys, such as AuGe, AuSn, AuSi, and AuIn.

Figure 11B:
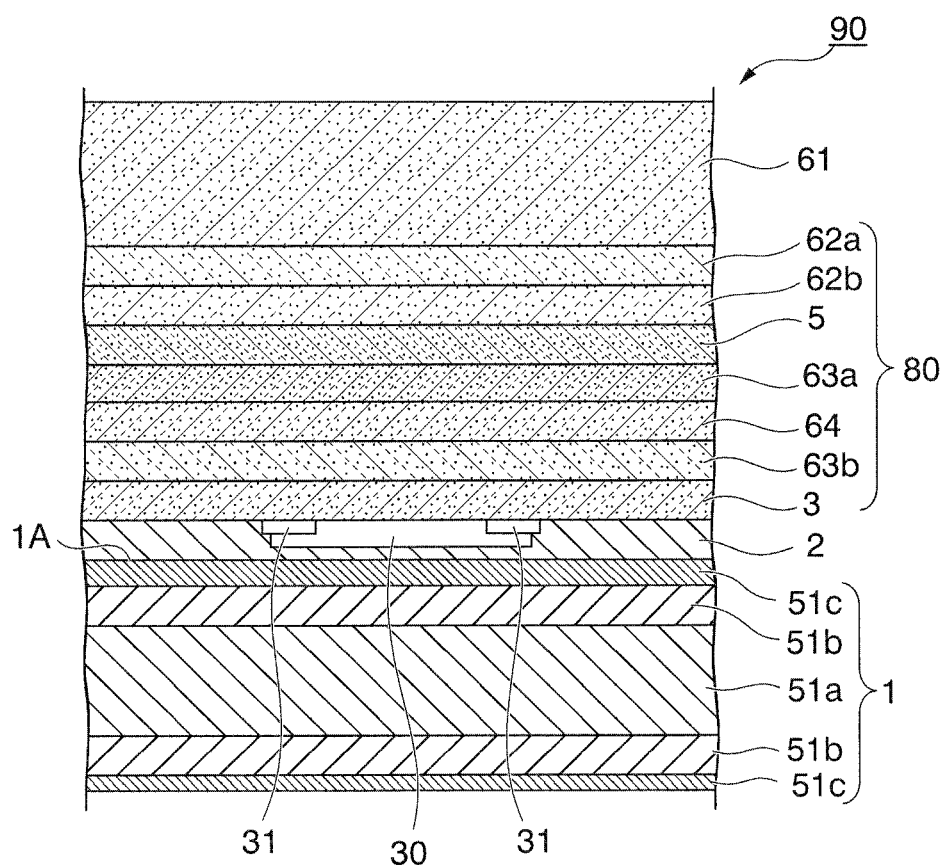
FIG. 11B is a process cross-sectional view illustrating an example of a method for producing a light-emitting diode according to a modification example of the first embodiment of the invention.

Then, as shown in FIG. 11B, the semiconductor substrate 61 having the epitaxial laminate 80, the reflecting layer 2 formed thereon and the metal substrate which is formed by the metal substrate manufacturing process are put into a decompression device and are arranged such that the bonding surface of the reflecting layer (a bonding surface of a bonding layer when the bonding layer is provided (the bonding layer is not shown in FIG. 11B)) and a bonding surface 1A of the metal substrate face and overlap each other.

Then, the inside of the decompression device is evacuated to $3 \times 10^{-5}$ Pa and the semiconductor substrate 61 and the metal substrate 1 which overlap each other are heated at 400° C. In this state, a load of 500 kg is applied to bond the bonding surface of the reflecting layer (the bonding surface of the bonding layer when the bonding layer is provided) and the bonding surface 1A of the metal substrate 1. In this way, a bonding structure 90 is formed.

Next, a case in which a Ge substrate is used as the supporting substrate 1 will be described.

<Process of Removing Semiconductor Substrate and Buffer Layer>

Figure 12:
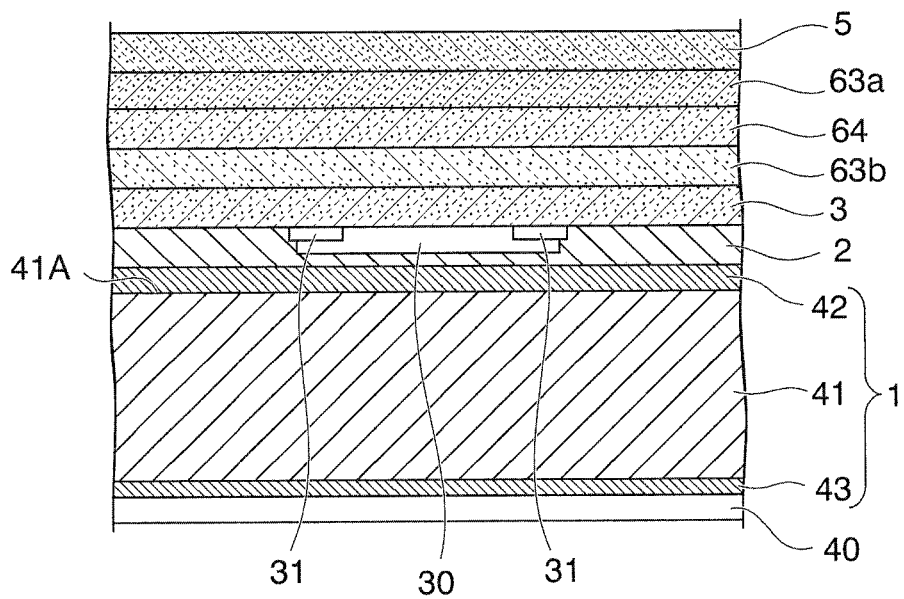
FIG. 12 is a process cross-sectional view illustrating an example of the method for producing the light-emitting diode according to the first embodiment of the invention.

Then, as shown in FIG. 12, the semiconductor substrate 61 and the buffer layer 62a are selectively removed from the bonding structure 90 with an ammonia-based etchant.

In this case, since the metal substrate according to this embodiment is covered with the metal protective film and has high resistance to an etchant, it is possible to prevent the deterioration of the quality of the metal substrate.

<Process of Removing Etching Stop Layer>

Then, as shown in FIG. 12, the etching stop layer 62b is selectively removed with a hydrochloric acid-based etchant.

Since the metal substrate according to this embodiment is covered with the metal protective film and has high resistance to an etchant, it is possible to prevent the deterioration of the quality of the metal substrate.

(Process of Forming Rear Surface Electrode)

Then, as shown in FIG. 12, a rear surface electrode 40 is formed on the rear surface of the metal substrate 1.

When the metal substrate is used as the supporting substrate 1, the rear surface electrode 40 doesn't have to be formed.

(Process of Forming Mesa Structure Portion)

Then, wet etching is performed on the compound semiconductor layer in a portion other than the mesa structure portion, that is, the contact layer and at least a portion of the active layer, or the contact layer, the active layer, and at least a portion of the bonding (contact) layer in order to form the mesa structure portion (except the protective film and the electrode film). Wet etching is performed on the contact layer 5 and the active layer 4 in order to form the mesa structure portion shown in FIG. 1.

Figure 13:
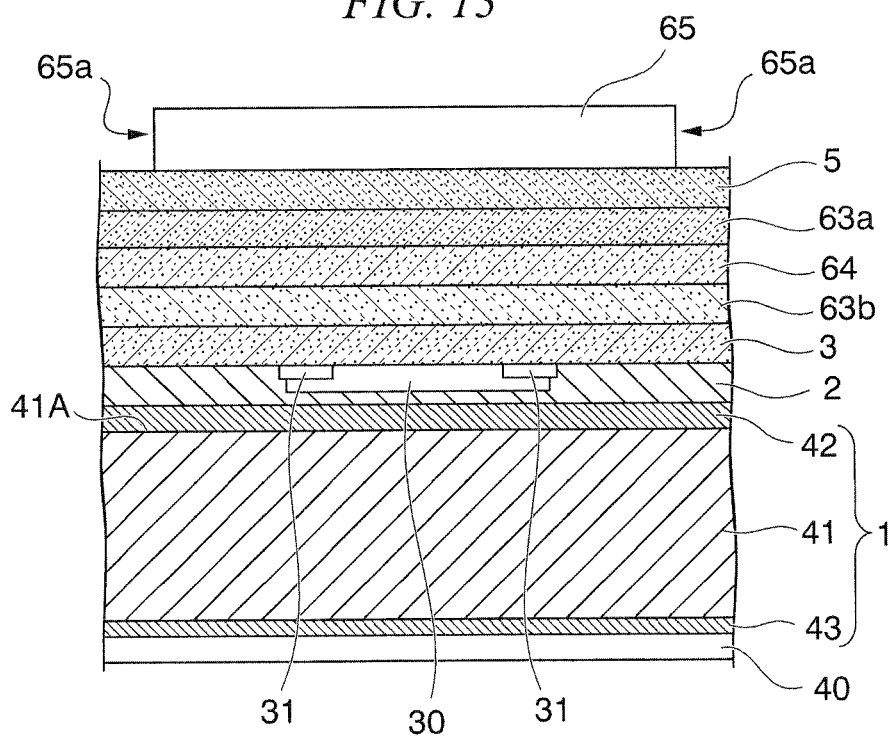
FIG. 13 is a process cross-sectional view illustrating an example of the method for producing the light-emitting diode according to the first embodiment of the invention.

Specifically, first, as shown in FIG. 13, a photoresist is deposited on the contact layer, which is the uppermost layer of the compound semiconductor layer, and a resist pattern 65 which has an opening 65*a* in a portion other than the mesa structure portion is formed by photolithography.

The shape of the mesa structure portion in plan view is determined by the shape of the opening 65*a* of the resist pattern 65. The opening 65*a* which has a shape corresponding to a desired shape in plan view is formed in the resist pattern 65.

It is preferable that the size of a portion of the resist pattern in which the mesa structure portion will be formed is about 10 µm greater than each of the upper, lower, left, and right sides of the top surface of the "mesa structure portion".

An etching depth, that is, the layer to be removed by etching in the compound semiconductor layer is determined by the type of etchant and an etching time.

After wet etching is performed, the resist is removed.

Then, wet etching is performed on the compound semiconductor layer in the portion other than the mesa structure portion.

An etchant used for the wet etching is not limited. An ammonia-based etchant (for example, a mixture of ammonia, hydrogen peroxide, and water) is suitable for an As-based compound semiconductor material such as AlGaAs. An iodine-based etchant (for example, potassium iodide/ammonia) is suitable for a P-based compound semiconductor material such as AlGaInP. A mixture of phosphoric acid, hydrogen peroxide, and water is suitable for an AlGaAs-based material. A mixture of bromine and methanol is suitable for a P-based material.

In a structure in which the compound semiconductor layer is made of only an As-based material, a phosphoric acid mixture may be used. In a structure in which As and a P-based material is mixed, an ammonia mixture may be used for an As-based structure portion and an iodine mixture may be used for a P-based structure portion.

When the above-mentioned compound semiconductor layer, that includes the contact layer 5 which is the uppermost layer and is made of AlGaAs, the cladding layer 63*a* which is made of AlGaInP, the light-emitting layer 64 which is made of AlGaAs, the cladding layer 63*b* which is made of AlGaInP, and the GaP layer 3, is used, it is preferable that different etchant is used for the As-based contact layer 5 and light-emitting layer 64 and the P-based layers, so that the etching speed is high in each layer.

For example, it is preferable that an iodine-based etchant is used to etch the P-based layer and an ammonia-based etchant be used to etch the As-based contact layer 5 and light-emitting layer 64.

For example, an etchant having iodine (I), potassium iodide (KI), pure water ($H_2O$), or ammonia water ($NH_4OH$) mixed therewith can be used as the iodine-based etchant.

In addition, for example, a mixture of ammonia, hydrogen peroxide, and water ($NH_4OH:H_2O_2:H_2O$) can be used as the ammonia-based etchant.

A case in which the portion other than the mesa structure portion is removed by the preferred etchant will be described. First, the contact layer 5 which is arranged in the portion other than the mesa structure portion and consists of AlGaAs is removed by etching with the ammonia-based etchant.

During the etching, since the cladding layer 63*a* which consists of AlGaInP, which is the next layer, functions as an etching stop layer, it is not necessary to strictly manage the etching time. For example, when the thickness of the contact layer 5 is about 0.05 µm, the etching may be performed for about 10 seconds.

Then, the cladding layer 63*a* which is arranged in the portion other than the mesa structure portion and consists of AlGaInP is removed by etching with the iodine-based etchant.

When an etchant containing 500 cc of iodine (I), 100 g of potassium iodide (KI), 2000 cc of pure water ($H_2O$), and 90 cc of ammonium hydroxide ($NH_4OH$) mixed with each other at this rate was used, the etching speed was 0.72 µm/min.

During the etching, since the light-emitting layer 64 which consists of AlGaAs, which is the next layer, functions as an etching stop layer, it is not necessary to strictly manage the etching time. For example, when the thickness of the cladding layer 63*a* is about 4 µm, the etching may be performed for about 6 minutes.

Then, the light-emitting layer 64 which is arranged in the portion other than the mesa structure portion and consists of AlGaAs is removed by etching with the ammonia-based etchant.

During the etching, since the cladding layer 63*b* which consists of AlGaInP, which is the next layer, functions as an etching stop layer, it is not necessary to strictly manage the etching time. For example, when the thickness of the light-emitting layer 64 is about 0.25 the etching may be performed for about 40 seconds.

Then, the cladding layer 63*b* which is arranged in the portion other than the mesa structure portion and consists of AlGaInP is removed by etching with the iodine-based etchant.

The GaP layer 3 is arranged below the cladding layer 63*b*. Since the exposure of the reflecting layer 2 which consists of metal and is arranged below the GaP layer 3 is not preferable in obtaining of electric characteristics, the GaP layer 3 also needs to function as an etching stop layer.

For example, when the GaP layer is formed to a thickness of 3.5 µm and is polished by 1 µm, the thickness of the GaP layer is 2.5 µm. When the thickness of the cladding layer 63*b* is 0.5 µm and the iodine-based etchant is used, the etching time needs to be equal to or less than 4 minutes.

When a mixture of phosphoric acid, hydrogen peroxide, and water (for example, $H_3PO_4:H_2O_2:H_2O=1$ to 3:4 to 6:8 to 10) is used, the etching can be performed for a wet etching time of 30 seconds to 120 seconds.

Figure 14:
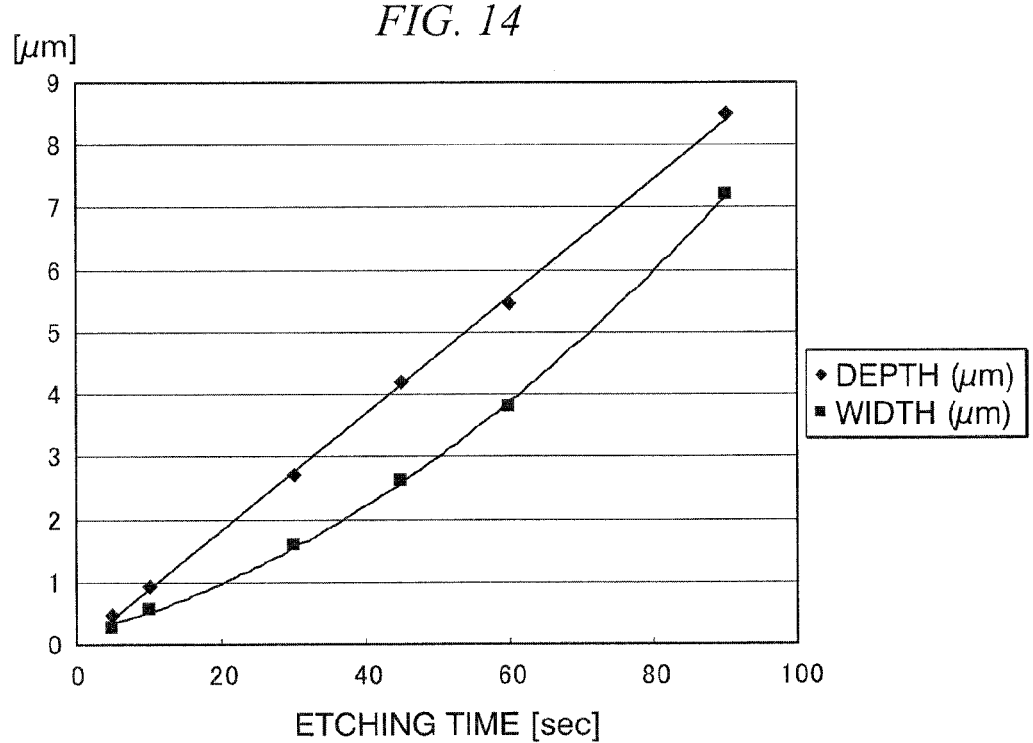
FIG. 14 is a graph illustrating the relationship between a depth, a width, and the etching time of wet etching.

FIG. 14 shows the relationship among the depth, the width, and the etching time when wet etching is performed on a compound semiconductor layer according to Example 1, which will be described below, using an etchant which is a mixture of $H_3PO_4:H_2O_2:H_2O=2:5:9$ (100:250:450), contains 56% of $H_2O$, and is at a temperature of 30° C. to 34° C. The conditions and results are numerically shown in Table 1.

TABLE 1

| Time (sec) | Depth (µm) | Width (µm) |
|---|---|---|
| 5 | 0.45 | 0.25 |
| 10 | 0.91 | 0.55 |
| 30 | 2.7 | 1.6 |
| 45 | 4.2 | 2.6 |
| 60 | 5.45 | 3.8 |
| 90 | 8.5 | 7.2 |

As can be seen from FIG. 14 and Table 1, the etching depth (corresponding to "h" in FIG. 1) is substantially proportional to the etching time (sec) and the rate of increase in the etching width increases as the etching time increases. That is, as shown in FIG. 3, as the depth increases (as it goes down in FIG. 14), the rate of increase in the horizontal cross-sectional area (or the width or diameter) of the mesa structure portion increases. The etching shape is different from an etching shape by dry etching. Therefore, it is possible to distinguish whether the mesa structure portion is formed by dry etching or wet etching on the basis of the shape of the inclined side surface of the mesa structure portion.

(Process of Forming Protective Film)

Then, the material forming the protective film 8 is deposited on the entire surface. Specifically, for example, a $SiO_2$ film is formed on the entire surface by a sputtering method.

(Process of Removing Protective Film Corresponding to Street and Contact Layer)

Then, a photoresist is deposited on the entire surface and a resist pattern in which a portion corresponding to the electrical conduction window 8b and a portion corresponding to the street are opened is formed on the contact layer by photolithography.

Then, for example, in the material forming the protective film 8, a portion corresponding to the electrical conduction window 8b in the top surface of the mesa structure portion and a portion corresponding to the street are removed by wet etching with a buffered hydrofluoric acid to form the protective film 8.

Figure 15:
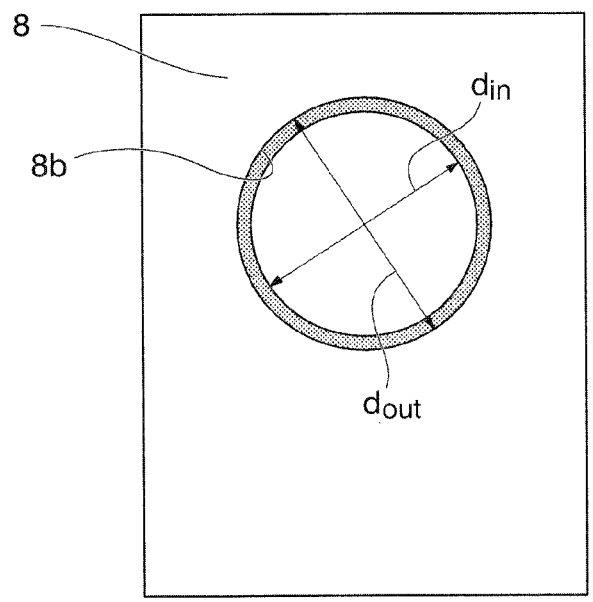
FIG. 15 is a plan view illustrating an electrical conduction window of a protective film of the light-emitting diode according to the first embodiment of the invention.
Figure 16:
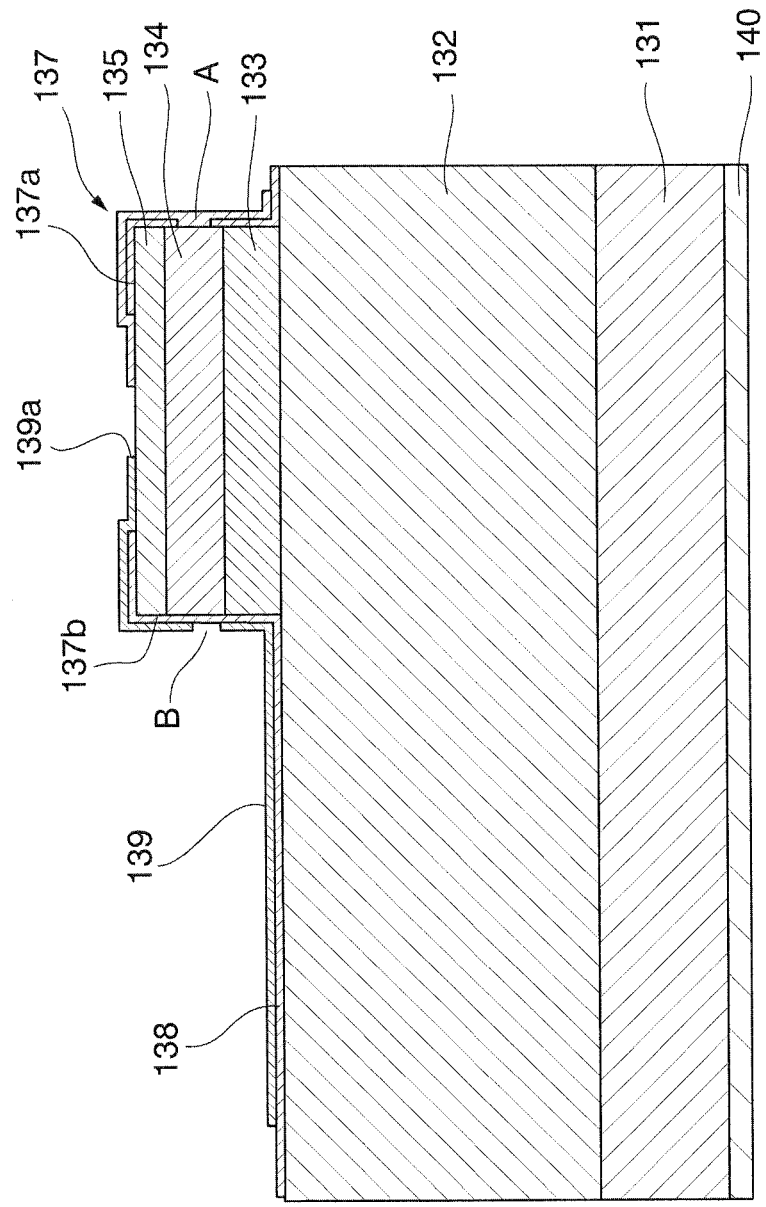
FIG. 16 is a cross-sectional view illustrating a light-emitting diode according to the related art.

FIG. 15 is a plan view illustrating the vicinity of the electrical conduction window 8b of the protective film 8.

Then, the resist is removed.

(Process of Forming Front Surface Electrode Film)

Then, the front surface electrode film 9 is formed. That is, the front surface electrode film 9 including the light emission hole 9b is formed on the protective film 8 and on a portion of the contact layer 5 which is exposed from the electrical conduction window 8b of the protective film 8.

Specifically, a photoresist is deposited on the entire surface and a resist pattern in which portions that include a portion corresponding to the light emission hole 9b and a cutting portion (street) between a plurality of light-emitting diodes on a wafer substrate and do not require the electrode film are opened is formed by photolithography. Then, an electrode film material is vapor-deposited. When the electrode film material is not sufficiently vapor-deposited on the inclined side surface of the mesa structure portion only by the vapor deposition, it is further vapor-deposited on the inclined side surface of the mesa structure portion by a planetary deposition apparatus in which deposition metal easily goes round.

Then, the resist is removed.

The shape of the light emission hole 9b is determined by the shape of the opening in the resist pattern (not shown). A resist pattern in which the shape of the opening corresponds to the desired shape of the light emission hole 9b is formed.

(Dividing Process)

Then, the wafer substrate is cut into light-emitting diodes.

Specifically, for example, the wafer substrate is cut into light-emitting diodes along the street portions by a dicing saw or a laser.

(Process of Forming Metal Protective Film on Side Surface of Metal Substrate)

When a metal substrate is used as the supporting substrate, the metal protective film may be formed on the cut side surface of the metal substrate of each divided light-emitting diode under the same conditions as those for forming the metal protective film on the upper surface and the lower surface.

Example

Hereinafter, the light-emitting diode according to the invention will be further described in detail using an example. However, the invention is not limited only to this example. In this example, a light-emitting diode lamp having a light-emitting diode chip mounted on a substrate was produced for characteristic evaluation.

In this example, with reference to FIGS. 1 and 4, the outside diameter R1 of an electrical conduction window 8b was 166 μm, the inside diameter thereof was 154 μm, the diameter R2 of a light emission hole was 150 μm, the outside diameter R3 of a transparent conductive film 30 was 160 μm, the width R5 (R6) of an ohmic metal portion was 6 and R4 was 152 μm.

First, a layer 42 consisting of a Ti layer with a thickness of 0.1 μm, an Au layer with a thickness of 0.5 μm, and an In layer with a thickness of 0.3 μm was formed on the surface of a germanium substrate 41. A layer 43 consisting of a Ti layer with a thickness of 0.1 μm and an Au layer with a thickness of 0.5 μm was formed on the rear surface of the germanium substrate 41.

Then, compound semiconductor layers were sequentially laminated on a GaAs substrate which consists of a Si-doped n-type GaAs single crystal to produce an epitaxial wafer with an emission wavelength of 730 nm.

The GaAs substrate had a surface which was inclined at an angle of 15° with respect to the (100) plane in the (0-1-1) direction as a growth surface and had a carrier concentration of $2 \times 10^{18}$ cm$^{-3}$. In addition, the thickness of the GaAs substrate was about 0.5 μm. The compound semiconductor layers include an n-type buffer layer 62a which consists of Si-doped GaAs, an etching stop layer 62b which consists of Si-doped $(Al_{0.5}Ga_{0.5})_{0.5}In_{0.5}P$, the contact layer 5 which consists of Si-doped n-type $Al_{0.3}GaAs$, an n-type upper cladding layer 63a which consists of Si-doped $(Al_{0.7}Ga_{0.3})_{0.5}In_{0.5}P$, an upper guide layer which consists of $Al_{0.4}Ga_{0.6}As$, a well layer/barrier layer 64 which consists of $Al_{0.17}Ga_{0.83}As/Al_{0.3}Ga_{0.7}As$, a lower guide layer which consists of $Al_{0.4}Ga_{0.6}As$, a p-type lower cladding layer 63b which consists of Mg-doped $(Al_{0.7}Ga_{0.3})_{0.5}In_{0.5}P$, a thin intermediate layer which consists of $(Al_{0.5}Ga_{0.5})_{0.5}In_{0.5}P$, and a Mg-doped p-type GaP layer 3.

In this example, the compound semiconductor layers were epitaxially grown on the GaAs substrate to a diameter of 50 mm and a thickness of 250 μm by using a low pressure metal organic chemical vapor deposition method (MOCVD apparatus) to form an epitaxial wafer. When the epitaxial growth layer was formed, trimethylaluminum (($CH_3$)$_3$Al), trimethylgallium (($CH_3$)$_3$Ga), and trimethylindium (($CH_3$)$_3$In) were used as a raw material for a group-III element. In addition, bis(cyclopentadienyl)magnesium (bis-($C_5H_5$)$_2$Mg) was used as a MG doping material. In addition, disilane ($Si_2H_6$) was used as a Si doping material. Phosphine ($PH_3$), arsine ($AsH_3$) were used as a raw material for a group-V element.

The growth temperature of each layer is as follows. The p-type GaP layer was grown at 750° C. The other layers were grown at 700° C.

The buffer layer which consisted of GaAs had a carrier concentration of about $2 \times 10^{18}$ cm$^{-3}$ and a thickness of about 0.5 μm. The etching stop layer had a carrier concentration of $2 \times 10^{18}$ cm$^{-3}$ and a thickness of about 0.5 μm. The contact layer had a carrier concentration of about $2 \times 10^{18}$ cm$^{-3}$ and a thickness of about 0.05 μm. The upper cladding layer had a carrier concentration of about $1 \times 10^{18}$ cm$^{-3}$ and a thickness of about 3.0 μm. The well layer was undoped, consisted of $Al_{0.17}Ga_{0.83}As$, and had a thickness of about 7 nm. The barrier layer was undoped, consisted of $Al_{0.3}Ga_{0.7}As$, and had a thickness of about 19 nm. Three pairs of the well layers and the barrier layers were alternately laminated. The lower guide layer was undoped and had a thickness of about 50 nm. The lower cladding layer had a carrier concentration of about $8\times10^{17}$ cm$^3$ and a thickness of about 0.5 μm. The intermediate layer had a carrier concentration of about $8\times10^{17}$ cm$^{-3}$ and a thickness of about 0.05 μm. The GaP layer had a carrier concentration of about $3\times10^{18}$ cm$^3$ and a thickness of about 3.5 μm.

Then, the GaP layer 3 was polished to a depth of about 1 μm from the surface by mirror polishing. The surface roughness of the GaP layer was 0.18 nm by the mirror polishing.

Then, an ohmic metal portion 31, which consisted of AuBe and had a thickness of 0.1 μm and a width R5 (R6) (see FIG. 4) of 6 μm, was formed on the GaP layer 3. Then, a transparent conductive film 30, which consisted of ITO and had a thickness of 150 nm and an outside diameter R3 (see FIG. 4) of 160 μm, was formed so as to cover the ohmic metal portion.

Then, a reflecting layer 2, which consisted of Au and had a thickness of 0.7 μm, was formed on the GaP layer 3 so as to cover the transparent conductive film 30. In addition, a Ti layer with a thickness of 0.5 μm was formed as the barrier layer on the reflecting layer and an AuGe layer with a thickness of 1.0 μm was formed as the bonding layer on the barrier layer.

Then, the structure having the compound semiconductor layers and the reflecting layer formed on the GaAs substrate and the metal substrate were arranged so as to face each other, were placed into the decompression device, and were heated at 400° C. In this state, a load of 500 kg was applied to bond the structure and the metal substrate, thereby forming a bonding structure.

Then, the GaAs substrate, which was a growth substrate for the compound semiconductor layers, and the buffer layer were selectively removed from the bonding structure by an ammonia-based etchant. In addition, the etching stop layer was selectively removed with a hydrochloric acid-based etchant.

(Process of Forming Rear Surface Electrode)

Then, an Au film with a thickness of 1.2 μm and an AuBe film with a thickness of 0.15 μm were sequentially formed on the rear surface of the metal substrate 1 by a vacuum vapor deposition method to form a rear surface electrode 40.

Then, in order to form a mesa structure portion, a resist pattern was formed and wet etching was performed with a mixture of ammonia, hydrogen peroxide, and water (NH$_4$OH:H$_2$O$_2$:H$_2$O) for 10 seconds to remove a current diffusion layer 55 in a portion other than the mesa structure portion.

Then, wet etching was performed with an iodine-based etchant which contained 500 cc of iodine (I), 100 g of potassium iodide (KI), 2000 cc of pure water (H$_2$O), and 90 cc of ammonium hydroxide water (NH$_4$OH) at this ratio for 45 seconds to remove the upper cladding layer 55 in the portion other than the mesa structure portion.

Then, wet etching was performed with the mixture of ammonia, hydrogen peroxide, and water (NH$_4$OH:H$_2$O$_2$:H$_2$O) for 40 seconds to remove the upper guide layer, the light-emitting layer 64, and the lower guide layer in the portion other than the mesa structure portion.

Then, wet etching was performed with the iodine-based etchant for 50 seconds to remove the lower cladding layer 63b in the portion other than the mesa structure portion.

In this way, the mesa structure portion was formed.

Then, in order to form a protective film, the protective film which consisted of SiO$_2$ was formed to have a thickness of about 0.5 μm.

Then, a resist pattern was formed and an opening (see FIG. 15) which had a concentric shape (an outside diameter dout: 166 μm; and an inside diameter din: 154 μm) in plan view and an opening for the street portion were formed by using a buffered hydrofluoric acid.

Then, in order to form a front surface electrode (film), after a resist pattern was formed, an AuGe film with a thickness of 0.5 μm, a Ni alloy film with a thickness of 0.5 μm, a Pt film with a thickness of 0.2 μm, and an Au film with a thickness of 1 μm were formed by a vacuum vapor deposition method, and the front surface electrode (n-type ohmic electrode) which included a light emission hole 9b with a circular shape (diameter: 150 μm) in plan view and had a long side of 350 μm and a short side of 250 μm was formed by a liftoff technique.

Then, a heat treatment was performed at 450° C. for 10 minutes to change the materials into an alloy, thereby forming a low-resistance n-type ohmic electrode.

Then, in order to form a light-leakage-prevention film 16 on the side surface of the mesa structure portion, after a resist pattern was formed, a Ti film with a thickness of 0.5 μm and an Au film with a thickness of 0.17 μm were sequentially formed by vapor deposition, and the light-leakage-prevention film 16 was formed by the liftoff technique.

Then, wet etching and laser cutting were sequentially performed to divide the wafer into light-emitting diodes. In this way, the light-emitting diode according to the example was manufactured.

100 light-emitting diode lamps, each having the manufactured light-emitting diode chip according to the example mounted on a mount substrate, were assembled. The light-emitting diode lamp was manufactured by supporting (mounting) a mount with a die bonder, connecting a p-type ohmic electrode and a p electrode terminal with a gold line using wire bonding, and performing sealing with a general epoxy resin.

In the light-emitting diode (light-emitting diode lamp), when a current flowed between the n-type electrode and the p-type electrode, infrared light with a peak wavelength 730 of nm was emitted. When a current of 20 milliamperes (mA) flowed in the forward direction, a forward voltage ($V_F$) was 1.7V. When the forward current was 20 mA, an emission output was 3.8 mW. A response speed (rise time: Tr) was 12.5 nsec.

The 100 produced light-emitting diode lamps had the same characteristics and there was no defect caused by leakage (short-circuit) when the protective film was a discontinuous film or an electrical conduction failure when the electrode metal film was a discontinuous film.

Comparative Example

A light-emitting diode according to a comparative example was formed by a liquid phase epitaxial method according to the related art. The light-emitting diode includes a light emission portion with a double hetero structure in which an Al$_{0.2}$Ga$_{0.8}$As light-emitting layer is formed on a GaAs substrate.

Specifically, the light-emitting diode according to the comparative example was manufactured by the liquid phase epitaxial method such that an n-type upper cladding layer that consisted of Al$_{0.7}$Ga$_{0.3}$As and had a thickness of 20 μm, an undoped light-emitting layer that consisted of Al$_{0.2}$Ga$_{0.8}$As and had a thickness of 2 μm, a p-type lower cladding layer that was made of Al$_{0.7}$Ga$_{0.3}$As and had a thickness of 20 μm, and a p-type thin layer that was made of Al$_{0.6}$Ga$_{0.4}$As, which was transparent with respect to an emission wavelength, and had a thickness of 120 μm were formed on an n-type GaAs single crystal substrate with the (100) plane. After the epitaxial growth, the GaAs substrate was removed. Then, an n-type ohmic electrode to a diameter of 100 μm was formed on the surface of the n-type AlGaAs substrate. Then, p-type ohmic electrodes with a diameter of 20 μm were formed on the rear surface of the p-type AlGaAs layer at intervals of 80 μm. Then, the substrate was cut by a dicing saw at intervals of 350 μm and a broken layer was removed by etching. In this way, the light-emitting diode chip according to the comparative example was manufactured.

When a current flowed between the n-type electrode and the p-type electrode, infrared light with a peak wavelength 730 of nm was emitted. When a current of 20 milliamperes (mA) flowed in the forward direction, a forward voltage ($V_F$) was about 1.9 volts (V). When the forward current was 20 mA, a light emission output was 5 mW. A response speed (Tr) was 15.6 nsec, which was later than that in the example according to the invention.

REFERENCE SIGNS LIST

1: SUPPORTING SUBSTRATE
2: REFLECTING LAYER
3: BONDING (CONTACT) LAYER
4: ACTIVE LAYER
5: CONTACT LAYER
6: FLAT PORTION
7: MESA STRUCTURE PORTION
7a: INCLINED SIDE SURFACE
7b: TOP SURFACE
7ba: PERIPHERAL REGION
8, 28: PROTECTIVE FILM
8b, 28b: ELECTRICAL CONDUCTION WINDOW
9, 29: ELECTRODE FILM
9b, 29b: LIGHT EMISSION HOLE
11: LOWER CLADDING LAYER
12: LOWER GUIDE LAYER
13: LIGHT-EMITTING LAYER
14: UPPER GUIDE LAYER
15: UPPER CLADDING LAYER
16: LIGHT LEAKAGE PREVENTION FILM
20: COMPOUND SEMICONDUCTOR LAYER
30: TRANSPARENT CONDUCTIVE FILM
30a: PERIPHERAL PORTION
31: OHMIC METAL PORTION
40: REAR SURFACE ELECTRODE
51c: METAL PROTECTIVE FILM
52: REFLECTING LAYER
56: REAR SURFACE ELECTRODE
61: SEMICONDUCTOR SUBSTRATE (GROWTH SUBSTRATE)
63a: UPPER CLADDING LAYER
63b: LOWER CLADDING LAYER
64: LIGHT-EMITTING LAYER
65: RESIST PATTERN
100, 200: LIGHT-EMITTING DIODE

What is claimed is:

1. A light-emitting diode that outputs light from a light emission hole to the outside, comprising:
   a reflecting layer that consists of metal; and
   a compound semiconductor layer that sequentially includes an active layer and a contact layer; on a supporting substrate in this order,
   wherein a flat portion and a mesa structure portion including an inclined side surface and a top surface are provided in an upper part of the light-emitting diode,
   wherein at least a part of the flat portion and at least a part of the mesa structure portion are sequentially covered with a protective film and an electrode film,
   the mesa structure portion includes at least a portion of the active layer,
   the inclined side surface is formed by wet etching,
   a cross-sectional area of the mesa structure portion in a horizontal direction is continuously reduced toward the top surface,
   the protective film covers at least a part of the flat portion, the inclined side surface of the mesa structure portion, and a peripheral region of the top surface of the mesa structure portion and the protective film includes an electrical conduction window which is provided inside the peripheral region in plan view and is arranged around the light emission hole and from which a portion of a surface of the compound semiconductor layer is exposed,
   the electrode film is a continuous film that comes into contact with the surface of the compound semiconductor layer which is exposed from the electrical conduction window, covers at least a portion of the protective film formed on the flat portion, and has the light emission hole on the top surface of the mesa structure portion, and
   a transparent conductive film is provided between the reflecting layer and the compound semiconductor layer at a position that corresponds to the electrical conduction window and in a range surrounded by the electrical conduction window in plan view,
   an ohmic metal portion that consists of AuBe or AuZn and is provided in a peripheral portion of the transparent conductive film which does not overlap the light emission hole in plan view, between the transparent conductive film and the compound semiconductor layer.

2. The light-emitting diode according to claim 1, wherein the transparent conductive film consists of any one of ITO, IZO, and ZnO.

3. The light-emitting diode according to claim 1, wherein the contact layer comes into contact with the electrode film.

4. The light-emitting diode according to claim 1, wherein the mesa structure portion has a rectangular shape in plan view.

5. The light-emitting diode according to claim 1, wherein the mesa structure portion has a height of 3 μm to 7 μm, and
   the width of the inclined side surface in plan view is in the range of 0.5 μm to 7 μm.

6. The light-emitting diode according to claim 1, wherein the light emission hole has a circular shape or an elliptical shape in plan view.

7. The light-emitting diode according to claim 6, wherein the light emission hole has a diameter of 50 μm to 150 μm.

8. The light-emitting diode according to claim 1, wherein a bonding wire is provided in a portion of the electrode film on the flat portion.

9. The light-emitting diode according to claim 1, wherein a light-emitting layer that is included in the active layer has a multiple quantum well structure.

10. The light-emitting diode according to claim 1, wherein a light-emitting layer that is included in the active layer consists of any one of $(Al_{X1}Ga_{1-X1})_{Y1}In_{1-Y1}P$ ($0 \leq X1 \leq 1$, $0 < Y1 \leq 1$), $(Al_{X2}Ga_{1-X2})As$ ($0 \leq X2 \leq 1$), and $(In_{X3}Ga_{1-X3})As$ ($0 \leq X3 \leq 1$).

11. A method of manufacturing a light-emitting diode that includes a reflecting layer made of metal and a compound semiconductor layer sequentially including an active layer and a contact layer, which are sequentially provided on a supporting substrate, in this order, and that emits light from a light emission hole to the outside, the method comprising:
- a step of forming the compound semiconductor layer that sequentially includes the active layer and the contact layer on a growth substrate;
- a step of forming a transparent conductive film on the compound semiconductor layer at a position that corresponds to an electrical conduction window to be formed and in a range surrounded by the electrical conduction window in plan view;
- a step of forming the reflecting layer made of metal on the compound semiconductor layer so as to cover the transparent conductive film;
- a step of bonding the supporting substrate to the reflecting layer;
- a step of removing the growth substrate;
- a step of performing wet etching for the compound semiconductor layer to form a mesa structure portion which is formed such that a cross-sectional area thereof in a horizontal direction is continuously reduced toward a top surface and a flat portion which is arranged around the mesa structure portion;
- a step of forming a protective film that covers, at least, a part of the flat portion, the inclined side surface of the mesa structure portion, and a peripheral region of the top surface of the mesa structure portion, and that includes the electrical conduction window which is provided inside the peripheral region in plan view and is arranged around the light emission hole in plan view and from which a portion of a surface of the compound semiconductor layer is exposed; and
- a step of forming an electrode film which is a continuous film that comes into direct contact with the surface of the compound semiconductor layer exposed from the electrical conduction window, that covers at least a portion of the protective film formed on the flat portion, and that has the light emission hole on the top surface of the mesa structure portion,
- a step of forming an ohmic metal portion that consists of AuBe or AuZn, that is provided in a peripheral portion of the transparent conductive film to be formed, and that does not overlap the light emission hole in plan view on the compound semiconductor layer, the step being performed between the step of forming the compound semiconductor layer and the step of forming the transparent conductive film.

12. The method of manufacturing a light-emitting diode according to claim 11,
wherein the wet etching is performed with at least one of a mixture of phosphoric acid, hydrogen peroxide, and water, a mixture of ammonia, hydrogen peroxide, and water, a mixture of bromine and methanol, and a mixture of potassium iodide, ammonia and water.

\* \* \* \* \*